United States Patent [19]

Yoshihara

[11] Patent Number: 5,500,378

[45] Date of Patent: Mar. 19, 1996

[54] PROCESS FOR FORMING A BIPOLAR TYPE SEMICONDUCTOR DEVICE

[75] Inventor: Ikuo Yoshihara, Kanagawa, Japan

[73] Assignee: Sony Corporation, Tokyo, Japan

[21] Appl. No.: 369,660

[22] Filed: Jan. 6, 1995

Related U.S. Application Data

[62] Division of Ser. No. 164,794, Dec. 10, 1993, Pat. No. 5,403,758.

[30] Foreign Application Priority Data

Dec. 14, 1992 [JP] Japan .................... 4-353495

[51] Int. Cl.⁶ ................... H01L 21/265; H01L 49/00
[52] U.S. Cl. .................... 437/31; 437/162; 437/200
[58] Field of Search .............. 437/31, 32, 162, 437/59, 164, 200

[56] References Cited

U.S. PATENT DOCUMENTS

| | | | |
|---|---|---|---|
| 4,236,294 | 12/1980 | Anatha et al. | 437/31 |
| 4,757,027 | 7/1988 | Vora | 437/162 |
| 4,778,774 | 10/1988 | Blossfeld | 437/162 |
| 4,868,135 | 9/1989 | Ogura et al. | 437/31 |
| 4,952,521 | 8/1990 | Goto | 437/33 |
| 4,957,875 | 9/1990 | Akbar et al. | 437/31 |
| 4,980,305 | 12/1990 | Kadota et al. | 437/67 |
| 5,006,476 | 4/1991 | DeJong et al. | 437/162 |
| 5,008,210 | 4/1991 | Chiang et al. | 437/67 |
| 5,075,241 | 12/1991 | Spratt et al. | 437/59 |
| 5,079,182 | 1/1992 | Ilderem et al. | 437/59 |
| 5,082,796 | 1/1992 | El-Diwany et al. | 437/162 |
| 5,139,961 | 8/1992 | Solheim et al. | 437/200 |
| 5,279,976 | 1/1994 | Hayden et al. | 437/162 |
| 5,302,535 | 4/1994 | Imai et al. | 437/31 |
| 5,324,672 | 6/1994 | Anmo et al. | 437/31 |
| 5,340,751 | 8/1994 | Maeda et al. | 437/59 |

*Primary Examiner*—Tuan H. Nguyen
*Attorney, Agent, or Firm*—Hill, Steadman & Simpson

[57] ABSTRACT

A semiconductor device in which a bipolar transistor is provided, such as a BiCMOS, and a production process thereof. The device has collector region of a first conductivity type; an intrinsic base region of a second conductivity type provided on the collector region; a graft base provided on the periphery of this intrinsic base region; and an emitter region of the first conductivity type provided by self-alignment with respect to the intrinsic base. A base electrode is provided in the upper portion where the graft base is scheduled to be formed. A trench is provided by self-alignment along the end portion on the outer circumference side of this base electrode. The graft base is provided in contact with the inner circumference of this trench.

9 Claims, 18 Drawing Sheets

PROCESS FOR FORMING A BIPOLAR TYPE SEMICONDUCTOR DEVICE

This is a division of application Ser. No. 08/164,794, filed Dec. 10, 1993, now U.S. Pat. No. 5,403,758.

BACKGROUND OF THE INVENTION

1. Field of the Invention

The present invention relates to a semiconductor device in which a bipolar transistor is provided, such as a BiCMOS, and a production process thereof, more specifically relates to a bipolar type semiconductor device having a small parasitic capacitance, excellent voltage resistance, the minimum dimensions and little variation in the transistor characteristic and to a production process thereof.

2. Description of the Related Art

For example, as disclosed in Denshi Joho Gakkaishi C-II (issued in November 1990, vol. J73-C-11, No. 11, page 759 to 766), a higher speed operation of an ultra-high speed bipolar transistor depends on how the parasitic capacitance can be reduced by wielding self-alignment technology. The construction of the bipolar transistor disclosed in this document adopts an OSET (outside emitter technology), in which a base contact region is provided at the center and an annular emitter region is provided at the outside thereof. By adopting this construction, irrespective of the miniaturization of the element, it becomes possible to relatively increase the surface area of the emitter region and, at the same time, to relatively reduce the base region. An increase of density by the reduction of the dimensions of the elements becomes possible simultaneously with the reduction of the parasitic capacitance. However, the technology disclosed in this document has a problem in that the production process becomes very complex.

Also, as a construction of the bipolar transistor which achieves a reduction of the parasitic capacitance and achieves an improvement of the speed, as shown in FIG. 48, there is adopted a construction in which an epitaxial layer 6 is deposited on the surface of a semiconductor substrate 4 in which a collector burying layer 2 is provided, a trench type isolation region 8 is formed on the surface of this epitaxial layer 6, and a graft base 10 is formed adjacent to this trench type isolation region 8. Note that, in the figure, reference numeral 12 denotes an intrinsic base region; 14, an emitter region, and 16, a base electrode.

In a bipolar transistor in which such a trench type isolation region 8 is provided, there is the effect that the parasitic capacitance between the collector and base is reduced in accordance with the portion where the graft base 10 and the isolation region 8 are in contact with each other.

The illustrated bipolar transistor also has a problem, however, in that the production process thereof are complex. Also, in this transistor, a matching margin of the base electrode must be ensured with respect to the trench type isolation region 8, and therefore the element becomes big in size and thus is not suitable for high density. Moreover, when it comes to the positional relationship between the trench type isolation region 8 and the emitter region 14, since the process is not a production process which is determined by self-alignment, there is a problem in that the characteristic of the bipolar transistor (for example the cut-off frequency $f_T$) varies.

Note that, Japanese Unexamined Patent Publication (Kokai) No. 63-244768 discloses a technology for forming the graft base by self-alignment with respect to the emitter electrode. By this technology, an improvement of the characteristics, for example, the reduction of the base resistance, can be expected, but this technology cannot reduce the parasitic capacitance between the emitter and base.

SUMMARY OF THE INVENTION

The present invention has been made in consideration with such an actual circumstance and has as an object thereof to provide a bipolar type semiconductor device which has a small parasitic capacitance at the joint portion, which is excellent in the voltage resistance, and in addition which has the minimum dimensions and little variation in the transistor characteristic. Also, an another object of the present invention is to provide a production process of a bipolar type semiconductor device with which a bipolar type semiconductor device having such excellent characteristics can be produced by a relatively easy and simple process.

So as to achieve the above-described objects, a bipolar type semiconductor device according to a first aspect of the present invention comprises a collector region of a first conductivity type; an intrinsic base region of a second conductivity type provided on this collector region; a graft base provided on the periphery of this intrinsic base region; an emitter region of the first conductivity type provided by self-alignment with respect to the intrinsic base region; a base electrode provided in the upper portion of a region in which the graft base is expected to be formed; and a trench type isolation region provided by self-alignment along an end portion on the outer circumference side of this base electrode, the graft base being provided in contact with the inner circumference of the trench type isolation region.

Also, a production process of a bipolar type semiconductor device according to the first aspect of the present invention comprises a step of forming a collector region of a first conductivity type on the surface of a semiconductor substrate; a step of forming on the surface of the semiconductor substrate a stopper layer covering a part corresponding to an intrinsic base region and having a first opening portion exposing a region including a graft base formed on the outer circumference of the intrinsic base region; a step of forming a conductive layer on the surface of the stopper layer in which the opening portion is provided; a step of forming a base electrode by etching this conductive layer with a pattern that partially overlap the first opening portion and forming a second opening portion exposing the surface of the stopper layer corresponding to the intrinsic base region at the end portion on the inner circumference side of the base electrode; a step of forming a trench on the surface of the semiconductor substrate partially exposed by the first opening portion along the end portion on the outer circumference side of the base electrode; a step of forming the intrinsic base region of a second conductivity type by self-alignment on the surface of the semiconductor substrate through the second opening portion provided along the end portion on the inner circumference side of the base electrode; a step of forming an insulation side wall with respect to the second opening portion and forming an emitter region of the first conductivity type by self-alignment on the surface of the intrinsic base region; and a step of diffusing an impurity substance of the second conductivity type from the base electrode into a region sectioned by the trench, to form the graft base on the substrate. Note that, in the present specification, there sometimes exists a case of use of the concept referred to as a semiconductor substrate including also an epitaxial layer formed on the surface of the semiconductor substrate.

Desirably the step of forming the second opening portion and the step of forming the trench are simultaneously carried out by the etching process at the patterning of the base electrode.

The conductive layer for the base electrode can be simultaneously formed by a polycide layer forming a gate electrode of an MOS transistor portion. Also, it is also possible to simultaneously form the trench at the time of etching when the gate electrode of the MOS transistor portion is subjected to the patterning.

Further, another production process of a bipolar type semiconductor device according to the first aspect of the present invention comprises a step of forming a collector region of a first conductivity type on the surface of a semiconductor substrate; a step of forming a conductive layer on the surface of the semiconductor substrate on which the collector region is provided; a step of forming an opening portion in the conductive layer with a pattern corresponding to an intrinsic base region; a step of forming a base electrode by etching the conductive layer by a resist film masked with the pattern for filling this opening portion and covering a graft base and forming a trench on the surface of the semiconductor substrate along the end portion on the outer circumference side of the base electrode; a step of forming the intrinsic base region of a second conductivity type by self-alignment on the surface of the semiconductor substrate through the opening portion provided along the end portion on the inner circumference side of the base electrode; a step of forming an insulation side wall with respect to the second opening portion and forming an emitter region of the first conductivity type by self-alignment on the surface of the intrinsic base region; and a step of diffusing an impurity substance of the second conductivity type from the base electrode into a region sectioned by the trench, to form the graft base.

A bipolar type semiconductor device according to a second aspect of the present invention comprises a collector region of a first conductivity type; an intrinsic base region of a second conductivity type provided on the collector region; a graft base provided on the periphery of this intrinsic base region; and an emitter region of the first conductivity type provided by self-alignment with respect to the intrinsic base region, wherein the intrinsic base region, emitter region, and an emitter take-out electrode are arranged in a vertical direction in a column-like projection portion surrounded by a trench provided on the surface of the semiconductor substrate; and the intrinsic base region provided in a lower portion of the column-like projection portion is connected to the graft base formed in a bottom portion of the trench.

Also, a production process of a bipolar type semiconductor device according to the second aspect of the present invention comprises the step of forming a collector region of a first conductivity type on the surface of a semiconductor substrate; a step of forming an impurity diffusion region for a base of a second conductivity type acting as an intrinsic base region on the surface of the semiconductor substrate on which the collector region is provided; a step of laying a conductive layer acting as an emitter electrode on this impurity diffusion region for a base; a step of forming a column-like projection portion having a lateral cross--section corresponding to an emitter region on the surface of the semiconductor substrate by etching the surface of the semiconductor substrate on which the conductive layer and the impurity diffusion region for a base are provided with a pattern corresponding to the emitter region and forming a trench on the periphery thereof; a step of forming an insulation side wall insulating the emitter region from a graft base on the side wall of the column-like projection; a step of forming in the bottom portion of the trench the graft base connected to the intrinsic base; and a step of forming the emitter region by diffusing the impurity of the first conductivity type contained in the conductive layer of the emitter electrode, formed in the upper portion of the column-like projection portion into the upper portion of the intrinsic base region positioned in the column-like projection portion.

The graft base can be formed by forming a base electrode inside the trench in which the insulation side wall is provided and then thermally diffusing an impurity of the second conductivity type contained in the conductive layer constituting this base electrode. Alternatively, the graft base is formed by introducing an impurity of the second conductivity type by ion implantation into the bottom portion of the trench in which the insulation side wall is provided, and thermally diffusing the same.

A bipolar type semiconductor device according to a third aspect of the present invention comprises a collector region of a first conductivity type; an intrinsic base region of a second conductivity type provided on this collector region; a graft base provided on the periphery of this intrinsic base region; and an emitter region of the first conductivity type provided by self-alignment with respect to the intrinsic base region, wherein the intrinsic base region, the emitter region, and an emitter take-out electrode being arranged in a vertical direction in a column-like projection portion surrounded by a first trench provided on the surface of the semiconductor substrate; and the intrinsic base region provided in a lower portion of the column-like projection portion being connected to the graft base formed in a bottom portion of the first trench, and the outer circumference of this graft base being defined by a second trench provided inside the first trench.

Also, a production process of a bipolar type semiconductor device according to the third aspect of the present invention comprises a step of forming a collector region of a first conductivity type on the surface of a semiconductor substrate; a step of forming an impurity diffusion region for a base of a second conductivity type acting as an intrinsic base region on the surface of the semiconductor substrate on which the collector region is provided; a step of laying a conductive layer for an emitter acting as an emitter electrode on this impurity diffusion region for a base; a step of forming a column-like projection portion having a lateral cross-section corresponding to an emitter region on the surface of the semiconductor substrate by etching the surface of the semiconductor substrate on which this conductive layer for emitter and the impurity diffusion region for base are provided with a pattern corresponding to the emitter region and forming a first trench on the periphery thereof; a step of forming an insulation side wall insulating the emitter region from a graft base on the side wall of this column-like projection; a step of forming a conductive layer for a base which acts as a base electrode so as to enter into the first trench; a step of forming a second trench for defining the outer circumference of the graft base on the outer circumference side of the bottom portion of the first trench when the base electrode is formed by patterning this conductive layer for a base; a step of forming the emitter region by diffusing the impurity of the first conductivity type contained in the conductive layer of the emitter electrode provided in the upper portion of the column-like projection portion into the upper portion of the intrinsic base region positioned inside the column-like projection portion; and a step of forming the graft base connected to the intrinsic base by thermally diffusing the impurity of the second conductivity type contained in the conductive layer constituting the base electrode in the bottom portion of the first trench surrounded by the second trench.

The conductive layer acting as the emitter take-out electrode can be simultaneously formed by the polycide layer forming a gate electrode of a MOS transistor portion. Also, the first trench can be formed simultaneously at the time of etching when the gate electrode of the MOS transistor portion is subjected to the patterning.

In the bipolar type semiconductor device according to the first aspect of the present invention, the trench is formed by self-alignment along the end portion on the outer circumference side of the base electrode, and the graft base is formed in contact with the inner circumference of this trench, and therefore the contact capacitance between the graft base and the epitaxial layer constituting the collector is reduced, and thus the voltage resistance between the base and collector is improved.

Also, in the production process of the bipolar type semiconductor device according to the first viewpoint of the present invention, the trench and emitter region are determined by self-alignment with respect to the base electrode, and therefore a bipolar type semiconductor device having the minimum dimensions and little variation in transistor characteristics ($f_T$, etc.) can be easily produced.

In the bipolar type semiconductor device according to the second aspect of the present invention, the intrinsic base region, emitter region, and emitter take-out electrode are arranged in a vertical direction in a column-like projection portion surrounded by the trench provided on the surface of the semiconductor substrate, and the intrinsic base region provided in a lower portion of the column-like projection portion is connected to the graft base formed in a bottom portion of the trench. Namely, the emitter region and base region are surrounded by the trench, and the emitter region and base region are joined in the vertical direction at substantially flat planes therefore without curved parts at the joint part. Accordingly, the capacitance at the periphery in the depth direction of the emitter region and the capacitance of the curved part at the corner portion of the emitter region can be reduced, and thus the capacitance between the emitter and base can be greatly reduced. Also, in the emitter-base contact, there is no curved part at which the voltage resistance is the weakest, and therefore the voltage resistance between the emitter and base is improved and, at the same time, the emitter clouding effect is reduced, and thus the transistor characteristics are improved.

Also, in the production process of the bipolar type semiconductor device according to the second aspect of the present invention, the trench and graft base are determined by self-alignment with respect to the emitter electrode, and therefore a semiconductor device having a bipolar transistor with the minimum dimensions and little variation in transistor characteristics ($f_T$, etc.) can be easily produced.

In the bipolar type semiconductor device according to the third aspect of the present invention, the intrinsic base region, emitter region, and emitter take-out electrode are arranged in a vertical direction in a column-like projection portion surrounded by the first trench provided on the surface of the semiconductor substrate, and the intrinsic base region provided in a lower portion of the column-like projection portion is connected to the graft base formed in a bottom portion of the first trench, and the outer circumference of this graft base is defined by the second trench provided inside the first trench. Namely, the emitter region and base region are surrounded by the first trench, and the emitter region and base region are joined in the vertical direction at their substantially flat planes without curved parts at the joint part. Accordingly, the capacitance at the periphery in the depth direction of the emitter region and the capacitance of the curved part at the corner portion of the emitter region can be reduced, and thus the capacitance between the emitter and base can be greatly reduced. Also, in the emitter-base contact, there is no curved part at which the voltage resistance is the weakest, and therefore the voltage resistance between the emitter and base is improved and, at the same time, the emitter clouding effect is reduced, and thus the transistor characteristics are improved. Further, in the third aspect of the present invention, the second trench is formed also on the periphery of the graft base, and therefore the capacitance between the base and collector is reduced, and also the voltage resistance between the base and collector is improved.

Also, in the production process of the bipolar type semiconductor device according to the third aspect of the present invention, the trench and graft base are determined by self-alignment with respect to the emitter electrode, and therefore a semiconductor device having a bipolar transistor with the minimum dimensions and little variation in transistor characteristics ($f_T$, etc.) can be easily produced.

DESCRIPTION OF THE PREFERRED EMBODIMENTS

Figure 1:
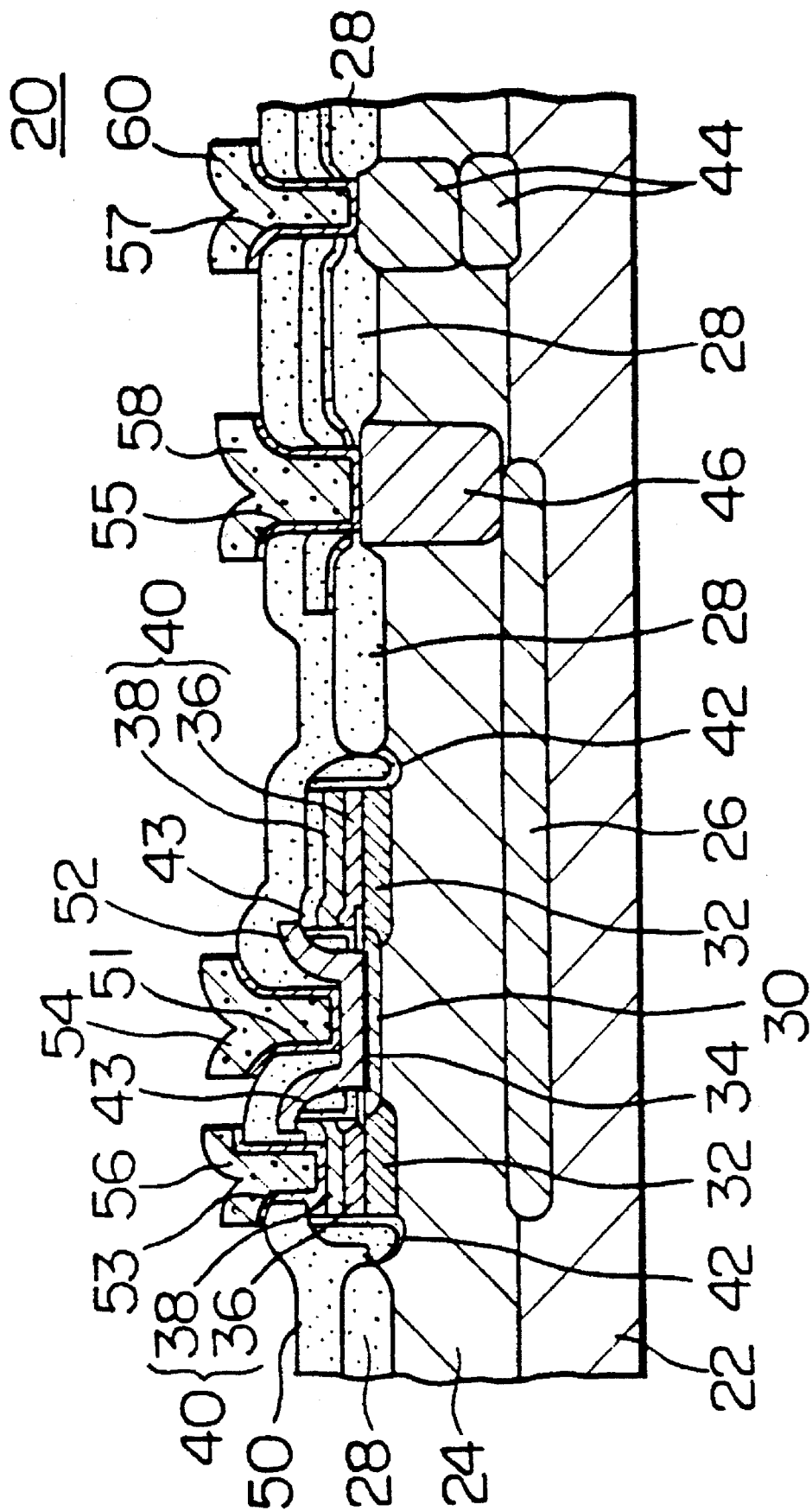
FIG. 1 is a schematic cross-sectional view showing one embodiment of a bipolar type semiconductor device according to a first aspect of the present invention.

Below, a detailed explanation will be made of the bipolar type semiconductor device according to the present invention and the production process thereof referring to embodiments shown in the drawings.

Art explanation will be made first of the embodiment according to the first aspect of the present invention. As shown in FIG. 1, the bipolar type semiconductor device 20 according to the present embodiment has a collector burying layer 26 provided near the boundary between a semiconductor substrate 22 and an epitaxial layer 24. The collector burying layer 26 has an n-type conductivity where an npn-bipolar transistor is robe formed and is doped with an n-type impurity. Where a pnp-bipolar-transistor is to be formed, a p-type impurity having an inverse conductivity type to this is doped. In the following explanation of the embodiments, an explanation is made taking a case where an npn-bipolar transistor is formed as an example, but the present invention can be similarly applied also to the case where a pnp-bipolar transistor is formed by all inverting conductivity types.

The conductivity type of the epitaxial layer 24 is an n-type. This epitaxial layer 24 acts as the collector region. On the surface of the epitaxial layer 24, a field insulating region 28 is provided by the selective oxidation method (LOCOS method) or the like with a predetermined pattern of isolating elements. On the surface of the epitaxial layer 24 surrounded by the field insulating region 28, an intrinsic base region 30 is provided. A graft base 32 is provided on the periphery thereof. The conductivity type of the intrinsic base region 30 and the graft base 32 is the p-type. On the surface of the intrinsic base region 30, the n-type emitter region 34 is provided by self-alignment. In the upper portion of the graft base 32, a base electrode 40 having a polycide construction comprising for example a polycrystalline silicon layer 36 and a silicide layer 38 is provided.

In the present embodiment, the base electrode 40 is formed in the upper portion of the region in which the graft base 32 is scheduled robe formed, the trench 42 is formed by self-alignment along the end portion on the outer circumference side of this base electrode 40, and the graft base 32 is formed in contact with the inner circumference of this trench 42.

Note that, in FIG. 1, reference numeral 43 denotes an insulation side wall for isolating the base and emitter; and reference numeral 44 denotes an impurity diffusion region for isolating the elements and to which the p-type impurity has been doped. Also, reference numeral 46 is a collector take-out region, to which the n-type impurity has been doped. Reference numeral 50 denotes an inter-layer insulating layer; reference numeral 52 denotes an emitter take-out electrode; reference numeral 54 denotes an electrode for an emitter; reference numeral 56 denotes an electrode for a base; reference numeral 58 denotes an electrode for a collector; and reference numeral 60 denotes an electrode for isolating the elements.

In the bipolar type semiconductor device 20 according to the present embodiment, the trench 42 is formed by self-alignment along the end portion on the outer circumference side of the base electrode 40, and the graft base 32 is provided in contact with the inner circumference of this trench 42, and therefore the contact capacitance between the graft base 32 and the epitaxial layer 24 constituting the collector is reduced, and thus the voltage resistance between the base and collector is improved.

Figure 2:
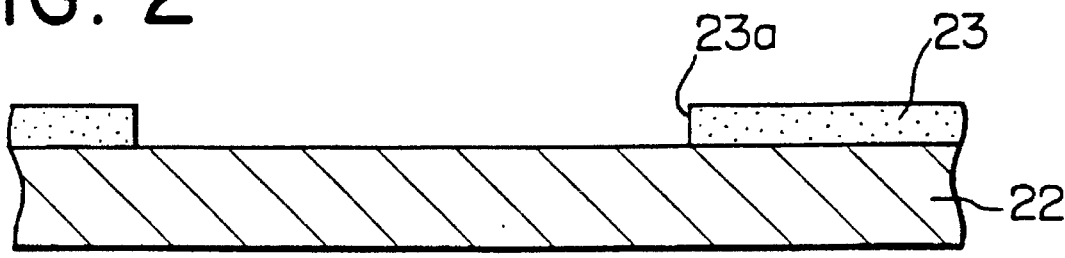
FIGS. 2 to 17 are schematic cross-sectional views showing production steps of the semiconductor device of the same embodiment.

Art explanation will be made next of the production process of the embodiment according to the first aspect of the present invention. In the present embodiment, first, as shown in FIG. 2, a semiconductor substrate 22 comprised of for example a silicon single crystal is prepared. The conductivity type of the semiconductor substrate 22 is the p-type in the present embodiment. A mask layer 23 is produced on the surface of this semiconductor substrate 22. The mask layer 23 is not particularly restricted, but may be constituted by a silicon oxide layer of 300 to 400 nm produced by for example the thermal oxidation method. In this mask layer 23, an opening portion 23a is formed by etching or the like with a pattern for forming the collector burying layer.

Figure 3:
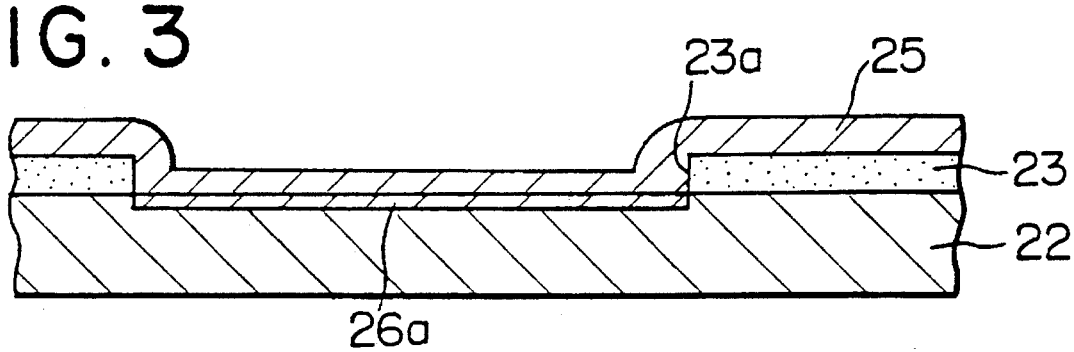

Next, as shown in FIG. 3, a doped layer 25 to which the impurity for forming the collector burying layer is produced from above the mask layer 23. The doped layer 25 is not particularly restricted, but maybe constituted by an impurity doped glass film produced by the CVD method or the like. Where the n-type burying layer is formed, it is constituted by an Sb glass film in which antimony Sb, which is an n-type impurity, has been doped.

Figure 5:
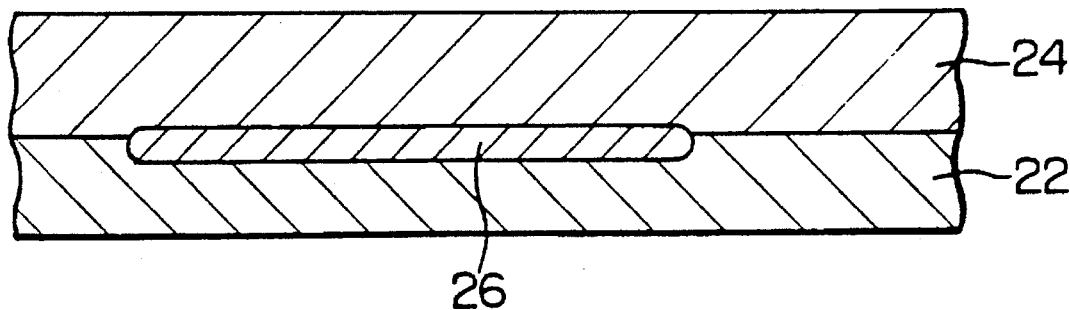

If the doped layer 25 to which the Sb has been doped is heat treated at about 1000° to 1300° C. together with the semiconductor substrate 22, the antimony contained in the glass film is thermally diffused in the surface of the semiconductor substrate 22 of the region corresponding to the opening portion 23a of the mask layer, and an impurity diffusion region 26a acting as a collector burying region 26 shown in FIG. 5 is formed. Note that, the method of introduction of the impurity for forming the collector region 26 is not restricted to the above-mentioned embodiment. It is also possible to perform the same by ion implantation.

Figure 4:
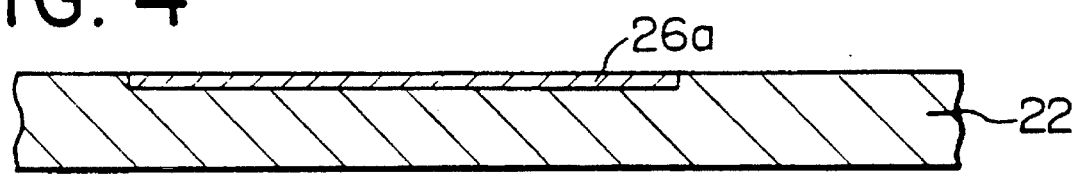

Next, as shown in FIG. 4, the doped layer 25 and mask layer 23 are removed by etching etc., and thereafter, as shown in FIG. 5, the epitaxial layer 24 is grown on the surface of the semiconductor substrate 22. The film thickness of this epitaxial layer is not particularly restricted, but maybe for example about 1 to 3 μm. This epitaxial layer 24 acts as the collector region of the npn-bipolar transistor, and therefore has an n-type conductivity type.

Figure 6:
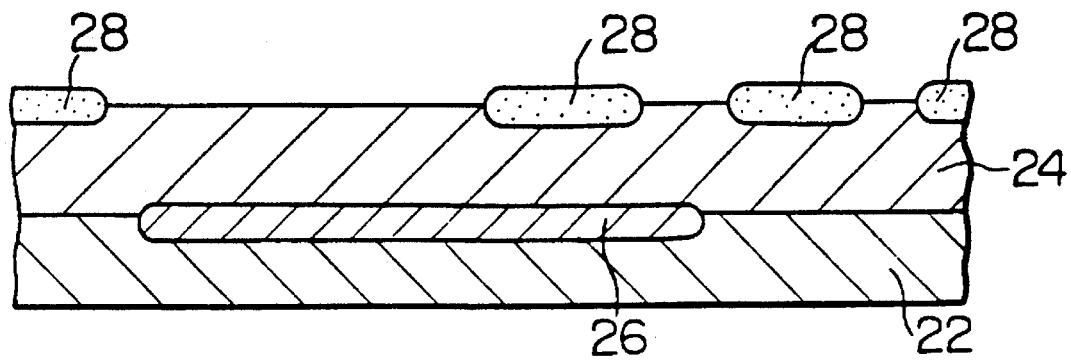

Next, as shown in FIG. 6, the selective oxidized field insulating region 28 is formed on the surface of the epitaxial layer 24 with the element isolation pattern with the use of the LOCOS method utilizing a silicon nitride film as the mask. The film thickness of the field insulating region 28 is not particularly restricted, but for example maybe about 300 nm.

Figure 7:
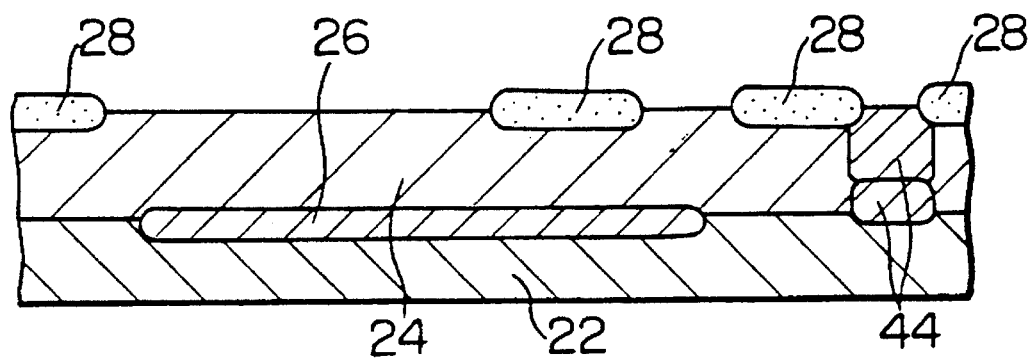

Next, as shown in FIG. 7, an impurity diffusion region 44 for isolating the elements is formed so as to isolate the elements of the region in which the bipolar transistor is to be formed. This impurity diffusion region 44 for isolating the elements is formed by selective ion implantation performed in for example a two-step manner. The ion-implanted impurity has a reverse conductivity type to that of the collector region. In the present embodiment, a p-type impurity such as boron is used.

Figure 8:
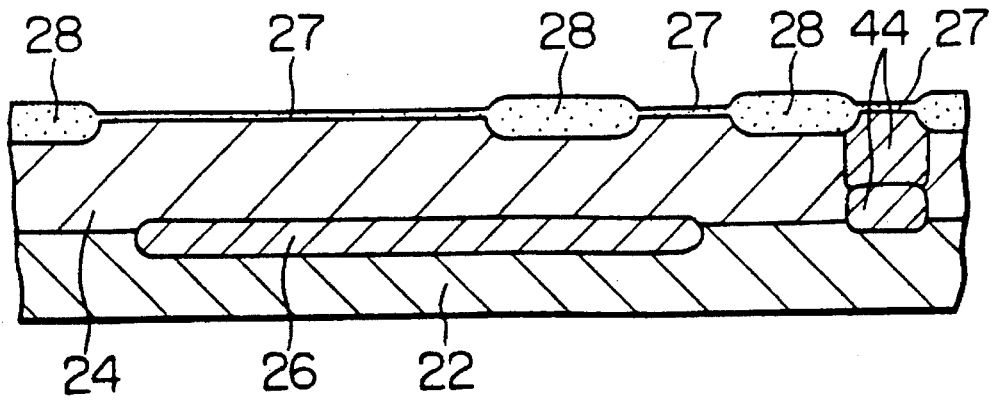

Next, as shown in FIG. 8, a stopper layer 27 is produced on the surface of the epitaxial layer 24 positioned between the field insulating regions 28. The stopper layer 27 is not particularly restricted, but may be constituted by for example a silicon oxide film formed by thermal oxidation and has a film thickness of for example about 15 nm to 25 nm. Where the semiconductor device obtained by the present invention is a semiconductor device in which a bipolar transistor such as a BiCMOS in which a bipolar transistor and an MOS transistor are mixed, this stopper layer 27 can be formed simultaneously with the gate insulating layer of the MOS transistor.

Figure 9:
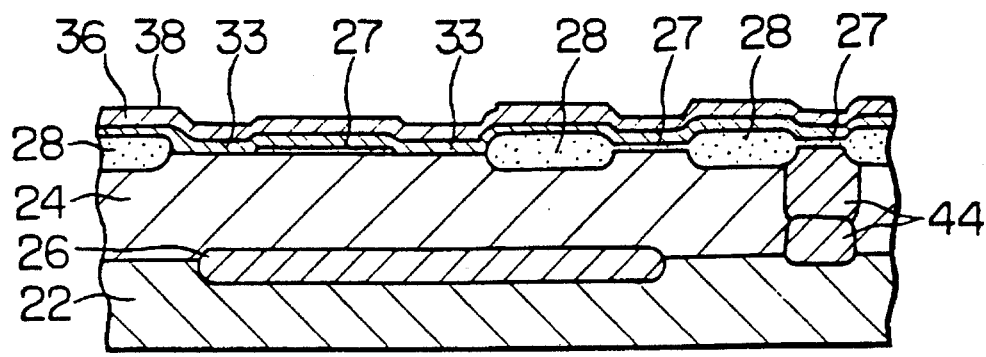

Next, as shown in FIG. 9, a first opening portion 33 is formed by etching etc. with respect to the stopper layer 27 of the region in which the bipolar transistor is to be formed. On the stopper layer 27, a first opening portion 33 is formed in a pattern covering a part scheduled to act as the intrinsic base region and exposing a part scheduled to act as the graft base. This first opening portion 33 acts as a so-called buried contact. Next, on the surface of the semiconductor substrate 22 on which the epitaxial layer 24, the field insulating region 28, and the stopper layer 27 are provided, a polycrystalline silicon layer 26 and the silicide layer 38 serving as the conductive layer to form the base electrode are sequentially laid. As the silicide layer, a tungsten silicide layer maybe exemplified. The polycrystalline silicon layer 36 and the silicide layer 38 constitute the polycide construction. The total film thickness of the polycrystalline silicon layer 36 and the silicide layer 38 is for example about 150 to 300 nm.

In the bipolar transistor region, the polycrystalline silicon layer 36 acts as the diffusion source for forming a graft base, and therefore after the polycrystalline silicon layer 36 and the silicide layer 38 are formed, a p-type impurity such as boron is doped in the entire surface by ion implantation. Note that, in the case of the BiCMOS process, the polycide electrode comprising the polycrystalline silicon layer 36 and the silicide layer 38 formed in the region of the bipolar transistor can be formed simultaneously in the region of the MOS transistor as the gate electrode of the MOS transistor. Note that, to the gate electrode of the MOS transistor, an n-type impurity such as phosphorus P is introduced, and therefore an n-type impurity such as phosphorus is ion-implanted in the MOS transistor-forming region and a p-type impurity such as boron is ion-implanted in the bipolar transistor-forming region, and thus it is necessary to divide up the ion implantation.

Figure 10:
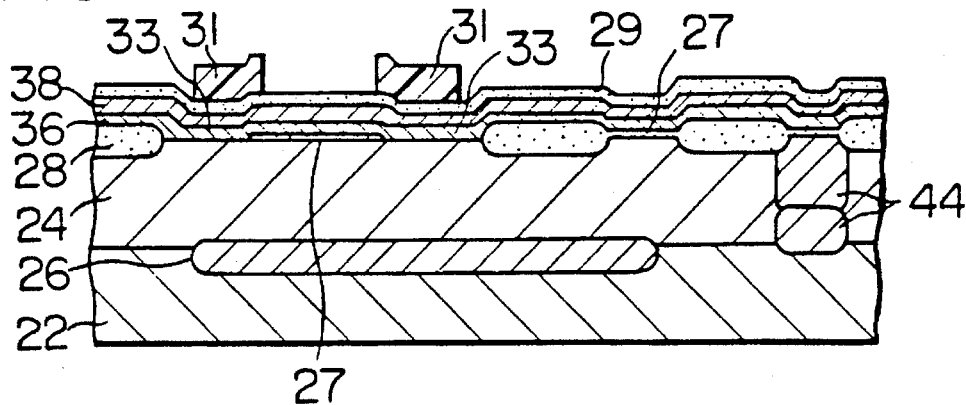

Next, as shown in FIG. 10, a cap layer 29 is laid on the polycide electrode. The cap layer 29 is constituted by the silicon oxide layer produced by for example the CVD method and has a film thickness of for example about 50 to 300 nm. Next, a resist film 31 is produced on this cap layer. The end portion on the inner circumference side of the resist film 31 is partially folded and superimposed on the stopper layer 27, and the end portion on the outer circumference side thereof is subjected to photolithography with a pattern covering most of all of the first opening portion 33.

Figure 11:
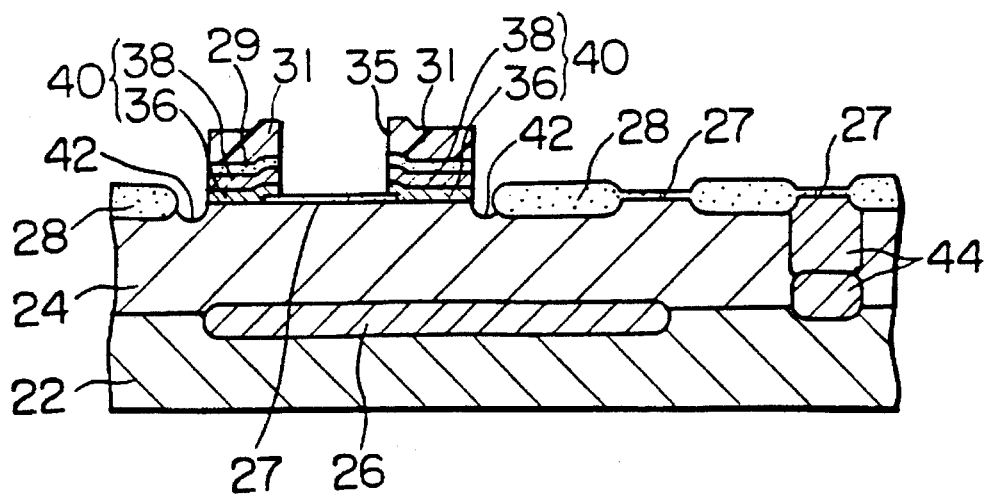

Next, as shown in FIG. 11, the base electrode 40 is formed by etching the cap layer 29, the silicide layer 38, and the polycrystalline silicon layer 36 using the resist film 31 as a mask. At the time of the etching for forming the base electrode 40, a second opening portion 35 exposing the surface of the stopper layer 27 is formed in the end portion on the inner circumference side of the electrode 40. Also, along the end portion on the outer circumference side of the base electrode 40, a trench 42 is formed on the surface of the epitaxial layer partially exposed by the first opening portion 33. In this part, the stopper layer 27 is not provided, and therefore the epitaxial layer 24 is over-etched under the etching condition for etching the polycrystalline silicon layer 36.

The formation of this trench 42 can be carried out simultaneously with the patterning of the gate electrode in the MOS transistor-forming region in for example a BiCMOS process. The depth of the formed trench 42 is not particularly restricted, but is preferably deeper than the depth of the graft base formed in the later steps and for example may be about 0.1 to 0.2 μm.

Figure 12:
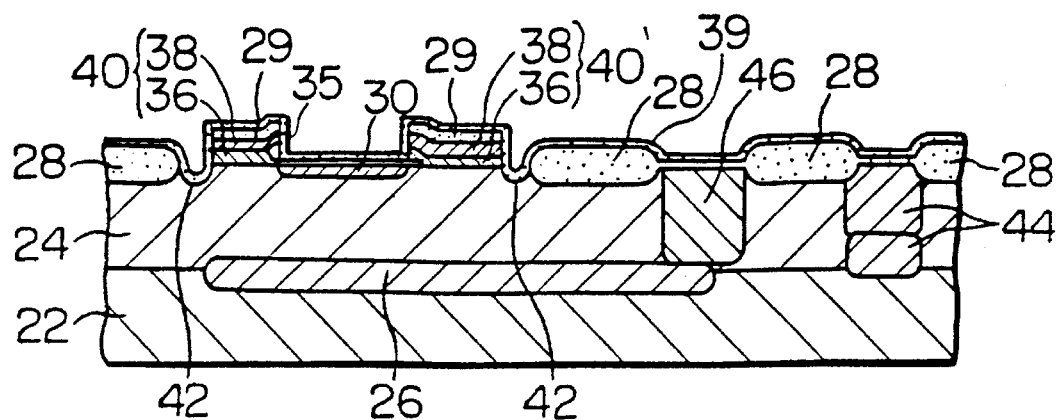

Next, as shown in FIG. 12, the buffer layer 39 is produced on the entire surface of the semiconductor substrate 22 on which the base electrode 40 etc. are formed. The buffer layer 39 is constituted by a silicon oxide film having a thickness of about 10 nm, produced by for example the CVD method. Note that, in the present embodiment, the buffer layer 39 does not always have to be present. Next, the selective ion implantation is carried out from above the buffer layer 39, and the intrinsic base region 30 is formed on the surface of the epitaxial layer 24 positioned beneath of the second opening portion 35. The intrinsic base region 30 has a p-type conductivity type in the present embodiment, and therefore a p-type impurity such as $BF_2$ is used as the impurity which is ion-implanted. The ion implantation conditions are not particularly restricted, but the conditions are for example a dosage of $1 \times 10^{13}$ $cm^{-2}$ and 100 KeV.

Moreover, the ion implantation for forming the collector take-out region 46 is carried out before or after this ion implantation step. The collector take-out region 46 is constituted by an n-type impurity diffusion region so as to be connected to the collector burying layer 26 and is formed by for example the ion implantation method. The ion implantation conditions are not particularly restricted. The conditions are for example the use of phosphorus P, a dosage of $1 \times 10^{15}$ $cm^{-2}$, and 500 KeV. After the ion implantation, heat treatment for diffusing the impurity is carried out. The heat treatment is carried out at the same temperature as the heat treatment temperature for forming the source-drain region in the case of for example the BiCMOS process. Concretely, the heat treatment temperature is for example 800° to 1000° C.

Figure 13:
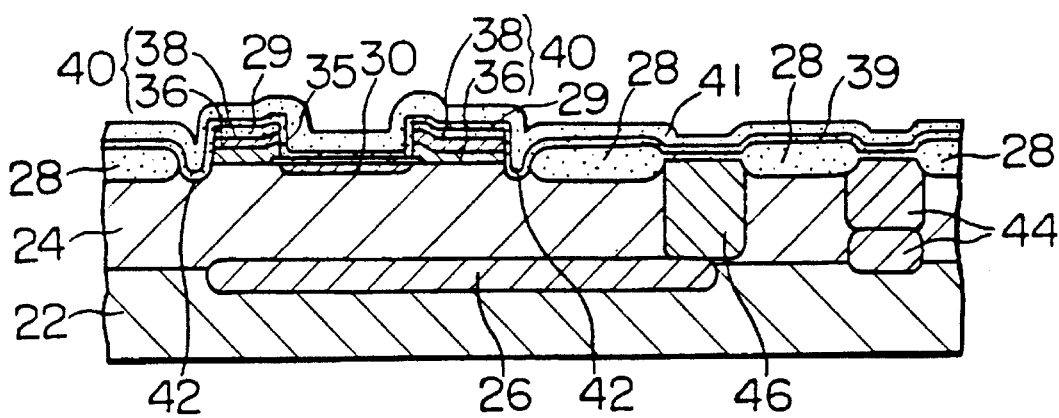

Next, as shown in FIG. 13, for forming the insulation side wall isolating the emitter and base, an insulating layer 41 is produced. The insulating layer 41 is constituted by a silicon oxide film having a thickness of about 100 to 300 nm produced by for example the CVD method.

Figure 14:
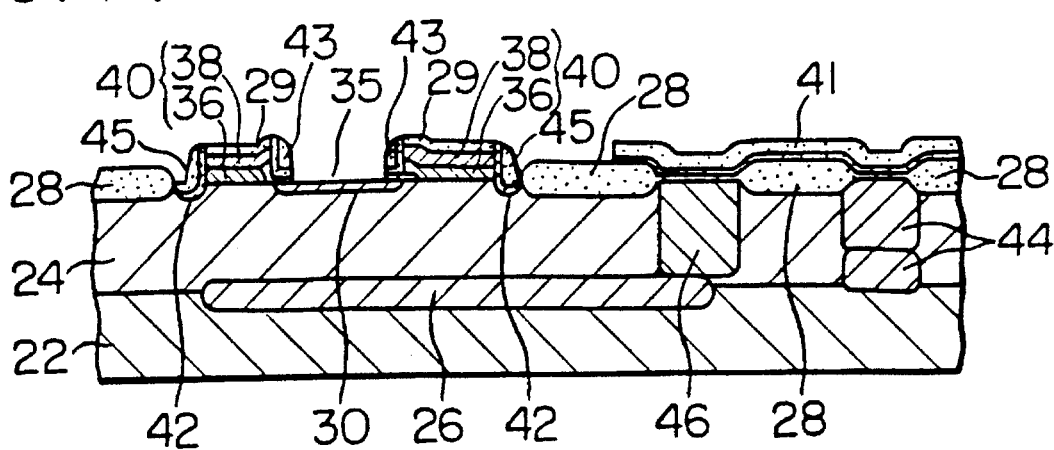

Next, as shown in FIG. 14, the insulating layer 41 is formed by anisotropic etching such as RIE, and the insulation side walls 43 and 45 are formed on both end portions of the base electrode 40. The insulation side wall 43 provided on the end portion on the inner circumference side of the base electrode 40 acts as the insulation side wall isolating the emitter and base. Also, the side wall 45 provided on the end portion on the outer circumference side of the base electrode 40 is deposited inside the trench 42 and ensures the insulating property of the trench.

Figure 15:
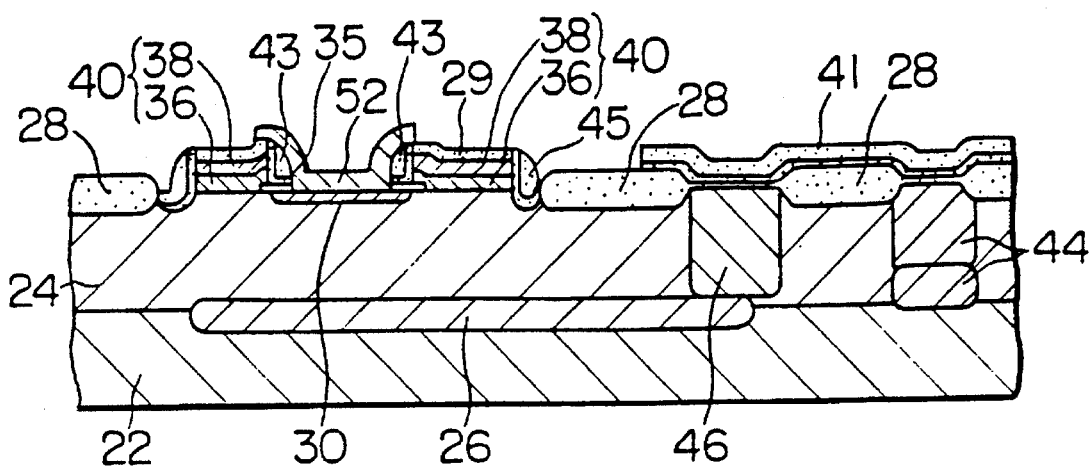

Next, as shown in FIG. 15, the polycrystalline silicon layer serving as the conductive layer forming the emitter take-out electrode 52 is produced on the entire surface to a film thickness of for example 200 nm so as to enter into the second opening portion 35 in which the insulation side wall 43 is provided, and the n-type impurity such as arsenic As, which is the impurity for forming the emitter, is ion-implanted to the entire surface of that polycrystalline silicon layer. Next, the polycrystalline silicon layer is subjected to the patterning by RIE or the like to obtain the emitter electrode 52. In the present embodiment, this emitter electrode 52 can be formed by self-alignment with respect to the intrinsic base region 30 by the insulation side wall 43 provided in the second opening portion 35.

Figure 16:
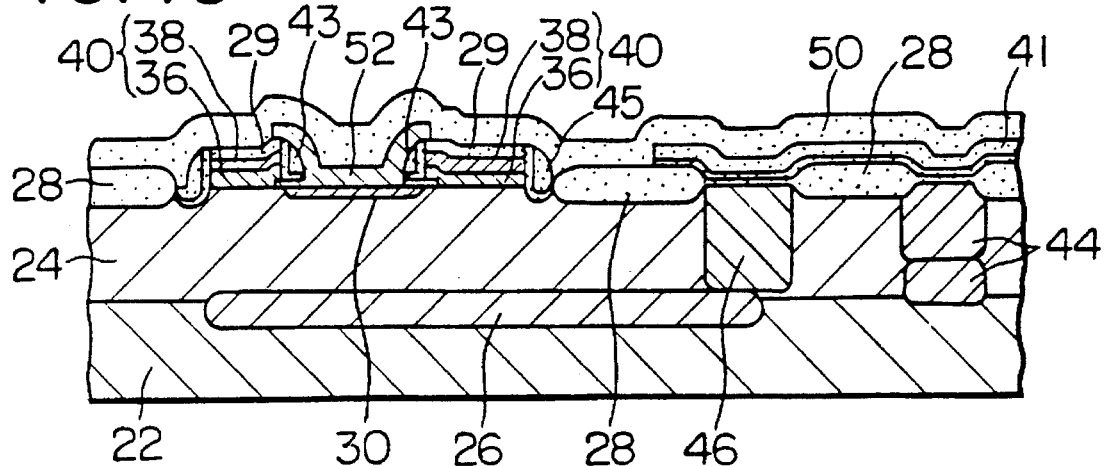

Next, as shown in FIG. 16, the inter-layer insulating layer 50 is laid on the surface of the semiconductor substrate on which the emitter take-out electrode 52 etc. are provided. The inter-layer insulating layer 50 is not particularly restricted, but may be constituted by a silicon oxide film produced by for example the CVD method or a reflow film such as a PSG film or a BPSG film. The film thickness of this inter-layer insulating layer is for example about 100 to 500 nm.

Figure 17:
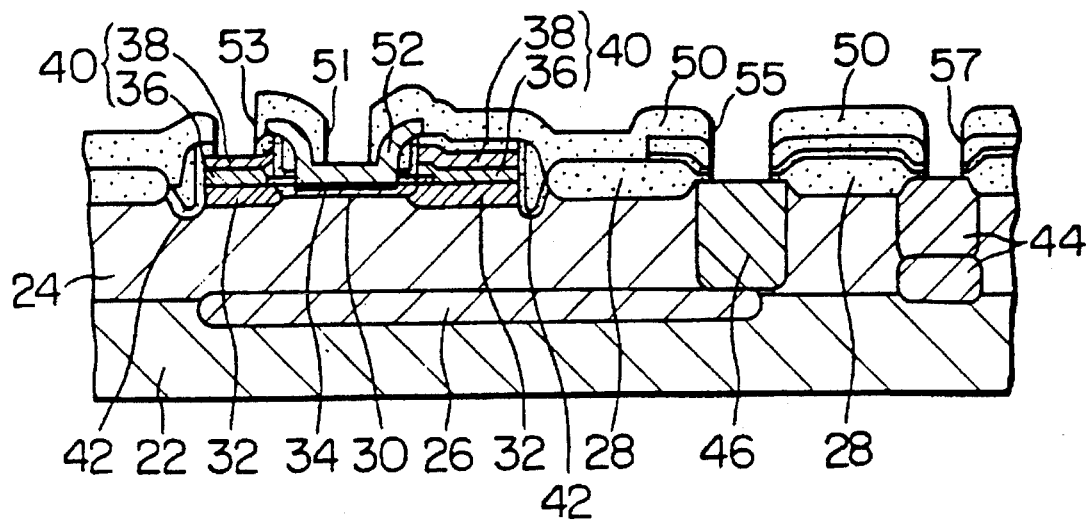

Next, as shown in FIG. 17, contact holes 51, 53, 55, and 57 for forming metal electrodes such as of aluminum by burying are formed through the inter-layer insulating layer 50. The contact hole 51 is a contact hole for the emitter electrode. The contact hole 53 is a contact hole for the base electrode. The contact hole 55 is a contact hole for the collector electrode. The contact hole 57 is a contact hole for the element isolating electrode.

The semiconductor substrate is subjected to an annealing treatment before or after the formation of these contact holes 51, 53, 55, and 57. The annealing temperature is for example about 900° C. By this annealing treatment, the n-type impurity such as arsenic As contained in the emitter take-out electrode 52 is thermally diffused in the surface of the intrinsic base region 30, and the emitter region 34 of $n^+$ is formed by self-alignment. Also, simultaneously, a p-type impurity such as baron B contained in the polycrystalline silicon layer 36 constituting the base electrode 40 is thermally diffused in the surface of the epitaxial layer 24 defined by the trench 42, so that a graft base 32 of $p^+$ is formed. Note that, where the reflow film is used as the inter-layer insulating layer 50, a taper is formed at the edge of the upper portion of the contact hole at the annealing treatment, and thus it is convenient.

Finally, as shown in FIG. 1, the electrodes 54, 56, 68, and 60 are formed in the respective contact holes 51, 53, 55, and 57. The electrodes are constituted by metal electrode such as for example aluminum. Preferably, the electrodes 54, 56, 58, and 60 have a two-layer construction in which a barrier metal such as titanium nitride is used as an underlying layer, and aluminum containing silicon is laminated thereon. This is for preventing the absorption of the silicon on the substrate side by the aluminum electrode and, at the same time, for preventing the spike of the aluminum electrode etc.

In the production process of the bipolar type semiconductor device according to the present embodiment, the trench 42 and the emitter region 34 are determined by self-alignment by the base electrode 40, and therefore a bipolar type semiconductor device having the minimum dimensions and little variation in the transistor characteristics ($f_T$, etc.) can be easily produced.

Next, an explanation will be made of another production process of a bipolar type semiconductor device according to the first aspect of the present invention. The present embodiment shares the same production steps as those shown in FIGS. 2 to 8 of the above-mentioned embodiment, therefore an explanation thereof will be omitted.

Figure 18:
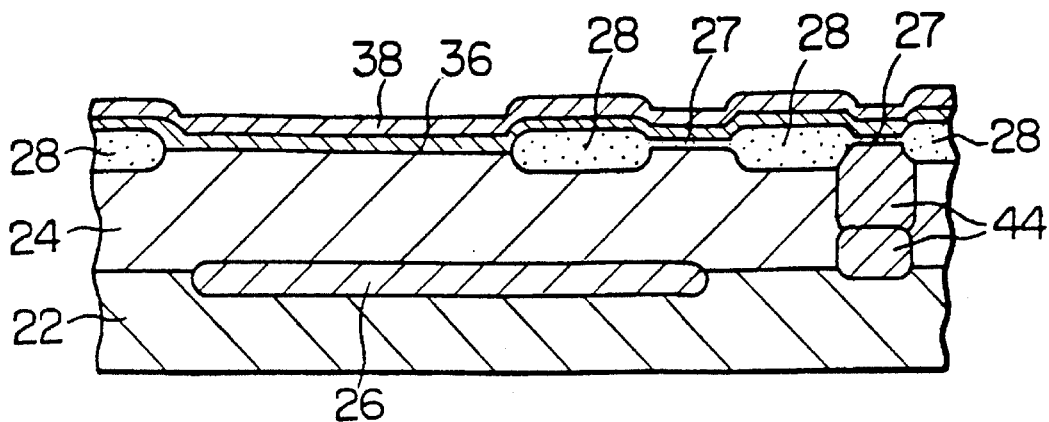
FIGS. 18 to 28 are schematic cross-sectional views showing another production process of the bipolar type semiconductor device according to the first aspect of the present invention.

In this embodiment, the collector burying layer 26, the epitaxial layer 24, the field insulating region 28, the stopper layer 27, and the impurity diffusion region for isolating the elements are formed on the surface of the semiconductor substrate 22 by the production process shown in FIGS. 2 to 8, and then, as shown in FIG. 18, the stopper layer 27 between the field insulating regions 28 in which the bipolar transistor is formed is selectivity removed. Next, on the surface of that semiconductor substrate, the polycrystalline silicon layer 36 and the silicide layer 38 serving as the conductive layer forming the base electrode are successively laid. As the silicide layer, a tungsten silicide layer may be mentioned. The polycrystalline silicon layer 36 and the silicide layer 38 constitute the polycide construction. The total film thickness of the polycrystalline silicon layer 36 and the silicide layer 38 is for example about 150 to 300 nm.

In the bipolar transistor region, the polycrystalline silicon layer 36 acts as the diffusion source for forming the graft base, and therefore after the polycrystalline silicon layer 36 and the silicide layer 38 are formed, a p-type impurity such as boron is doped into the entire surface by ion implantation. Note that, in the case of the BiCMOS process, the polycide electrode comprising the polycrystalline silicon layer 36 and the silicide layer 38 formed in the region of the bipolar transistor can be formed simultaneously in the region of the MOS transistor as the gate electrode of the MOS transistor. Note, in the gate electrode of the MOS transistor, an n-type impurity such as phosphorus P is introduced, and therefore in the MOS transistor-forming region, an n-type impurity such as phosphorus is ion-implanted, and in the bipolar transistor-forming region, a p-type impurity such as boron is ion-implanted, and thus it is necessary to divide the ion implantation.

Figure 19:
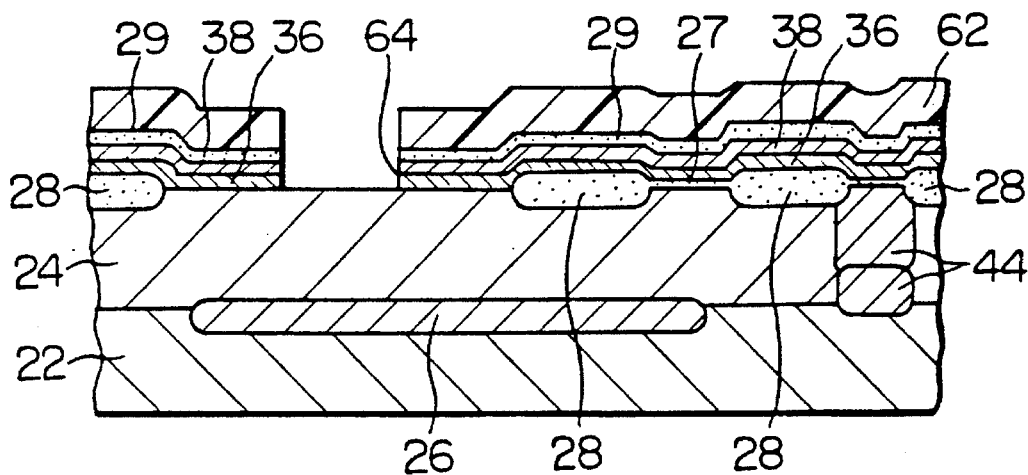

Note that, as shown in FIG. 19, on the polycide electrode, a cap layer 29 is produced. The cap layer 29 is constituted by a silicon oxide layer produced by for example the CVD method, and the film thickness thereof is for example about 50 to 300 nm. Next, a resist film 62 is laid on this cap layer. The resist film 62 is subjected to photolithography so that the opening portion is formed in the pattern corresponding to the intrinsic base region mentioned later. Next, the cap layer 29, the silicide layer 38, and the polycrystalline silicon layer 36 are etched by RIE or the like using this resist film 62 as a mask, whereby the opening portion 64 is formed, to expose the surface of the epitaxial layer 24 corresponding to the intrinsic base region.

Figure 20:
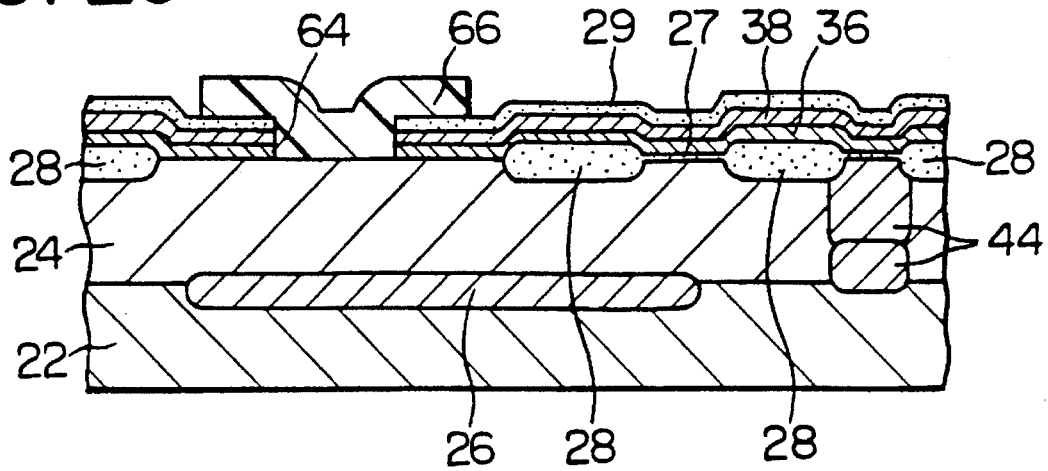

Next, as shown in FIG. 20, a resist film 66 is laid on the surface of the cap layer 29 in a pattern filling the opening portion 64 and covering the graft base.

Figure 21:
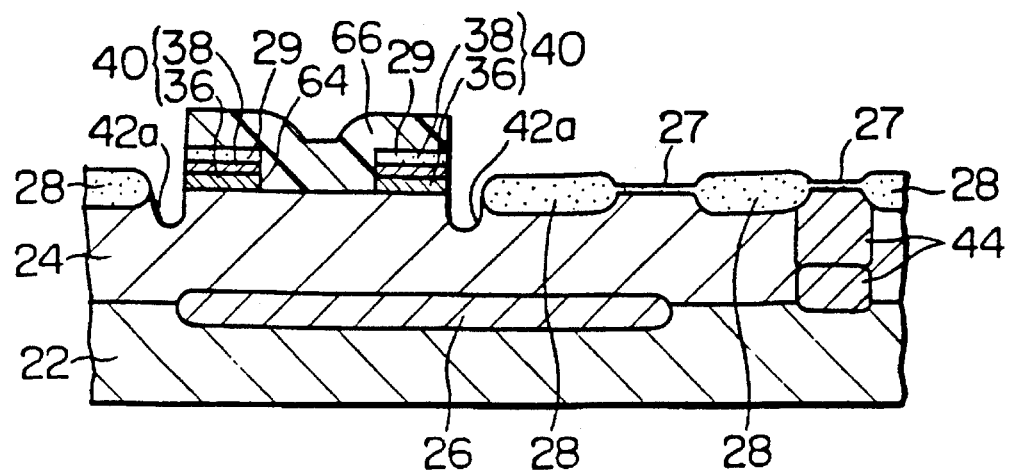

Next, as shown in FIG. 21, if the cap layer 29, the silicide layer 38, and the polycrystalline silicon layer 36 are etched by RIE or the like using this resist film 66 as a mask, the pattern of the base electrode 40 having the polycide construction comprising the polycrystalline silicon layer 36 and the silicide layer 38 is completed. At this time, the trench 42a is formed by self-alignment on the surface of the epitaxial layer 24 along the end portion on the outer circumference side of the base electrode. In this part, the stopper layer 27 is not provided, and therefore the epitaxial layer 24 is over-etched under the etching conditions for etching the polycrystalline silicon layer 36.

In this embodiment, in comparison with the aforementioned embodiments, the base electrode 40 is formed by two patternings, and therefore the number of manufacturing steps is increased, but has an advantage that the groove depth of the trench 42a can be freely controlled and, at the same time, has an advantage that the size of the base can be correctly controlled just by the base electrode 40.

Figure 22:
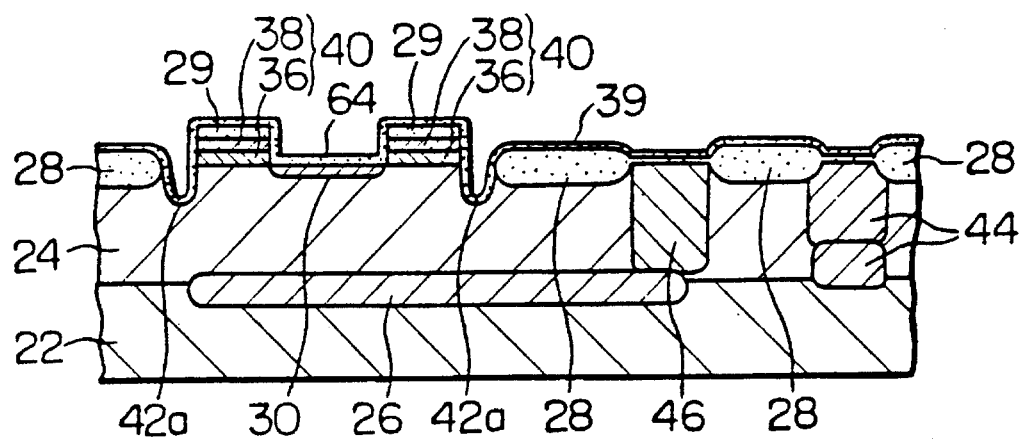

After the trench 42a is formed, as shown in FIG. 22, the buffer layer 39 is produced on the surface of the semiconductor substrate. The buffer layer 39 is constituted by a silicon oxide film having a thickness of about 10 nm produced by for example the CVD method. The buffer layer 39 protects the polycide electrode and, at the same time, has a control function at the ion implantation. Note that, in the present embodiment, the buffer layer 39 does not always have to exist. Next, the selective ion implantation is carried out from above the buffer layer 39, and the intrinsic base region 30 is formed on the surface of the epitaxial layer 24 positioned beneath of the opening portion 64. The intrinsic base region 30 has a p-type conductivity type in the present embodiment, and therefore a p-type impurity such as $BF_2$ is used as the impurity which will be ion-implanted. The ion implantation conditions are not particularly restricted, but the conditions may be for example a dosage of $1\times10^{13}$ $cm^{-2}$ and 100 KeV.

Moreover, the ion implantation for forming the collector take-out region 46 is carried out before or after this ion implantation step. The collector take-out region 46 is constituted by an n-type impurity diffusion region so as to be connected to the collector burying layer 26 and is formed by for example the ion implantation method. The ion implantation conditions are not particularly restricted, and the conditions are for example the use of the phosphorus P, a dosage of $1\times10^{15}$ cm$^{-2}$, and 500 KeV. After the ion implantation, heat treatment for diffusing the impurity is carried out. The heat treatment is carried out at the same temperature as the heat treatment temperature for forming the source drain region in the case of for example the BiCMOS process. Concretely, the heat treatment temperature is for example 800° to 1000° C.

Figure 23:
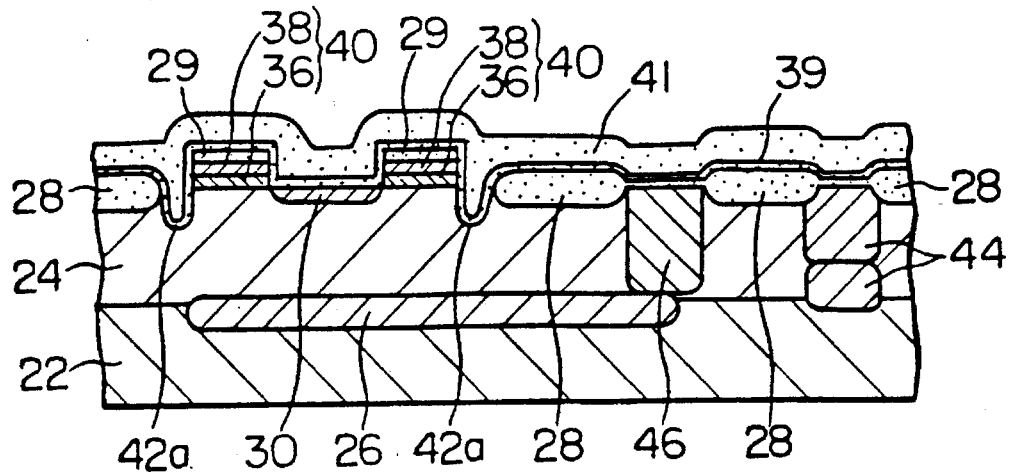

Next, as shown in FIG. 23, for forming the insulation side wall isolating the emitter and base, an insulating layer 41 is produced. The insulating layer 41 is constituted by a silicon oxide film having a thickness of about 100 to 300 nm produced by for example the CVD method.

Figure 24:
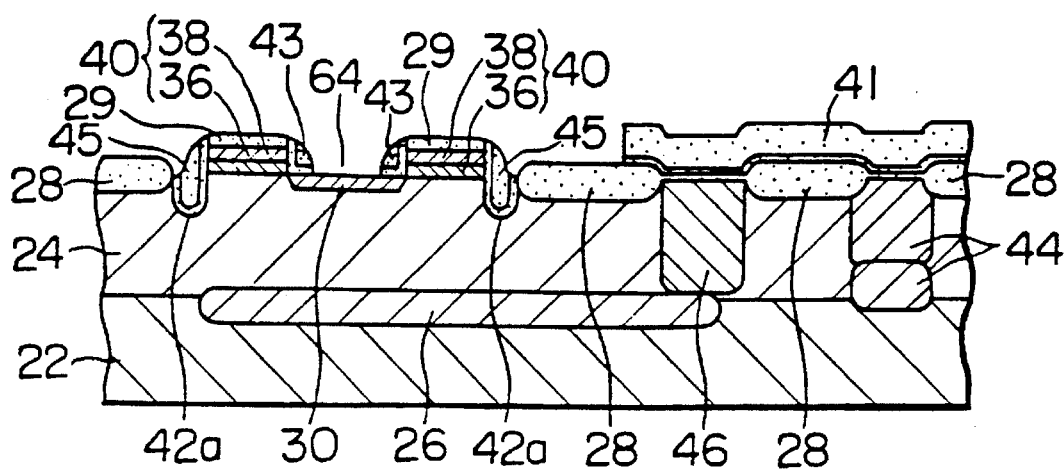

Next, as shown in FIG. 24, the insulating layer 41 is formed by anisotropic etching such as RIE, and the insulation side walls 43 and 45 are formed on both end portions of the base electrode 40. The insulation side wall 43 provided on the end portion on the inner circumference side of the base electrode 40 acts as an insulation side wall isolating the emitter and base. Also, the side wall 45 provided on the end portion on the outer circumference side of the base electrode 40 is deposited inside the trench 42 and ensures the insulating property of the trench.

Figure 25:
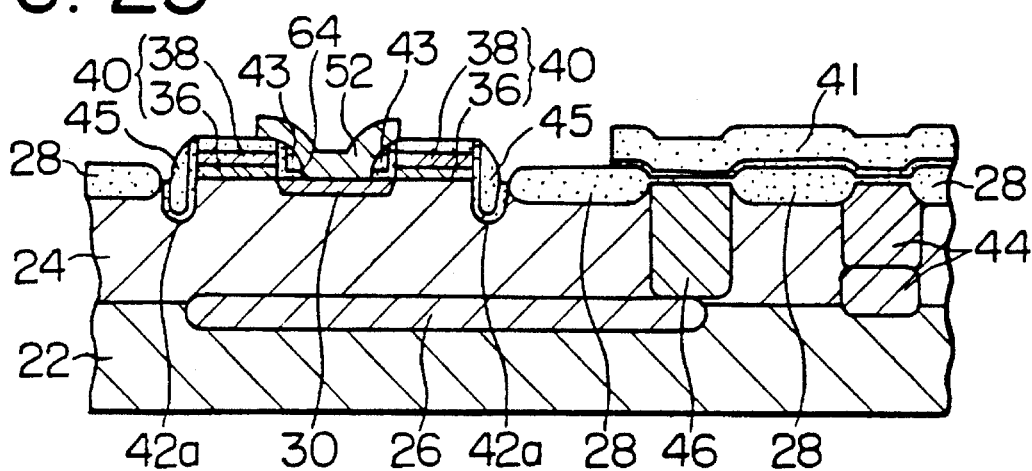

Next, as shown in FIG. 25, the polycrystalline silicon layer serving as the conductive layer forming the emitter take-out electrode 52 is produced on the entire surface to a film thickness of for example 200 nm so as to enter into the opening portion 64 in which the insulation side wall 43 is provided. An n-type impurity such as arsenic As, which is the impurity for forming the emitter, is ion-implanted to the entire surface of that polycrystalline silicon layer. Next, the polycrystalline silicon layer is subjected to patterning by RIE or the like to obtain an emitter electrode 52. In the present embodiment, this emitter electrode 52 can be formed by self-alignment with respect to the intrinsic base region 30 by the insulation side wall 43 provided in the opening portion 64.

Figure 26:
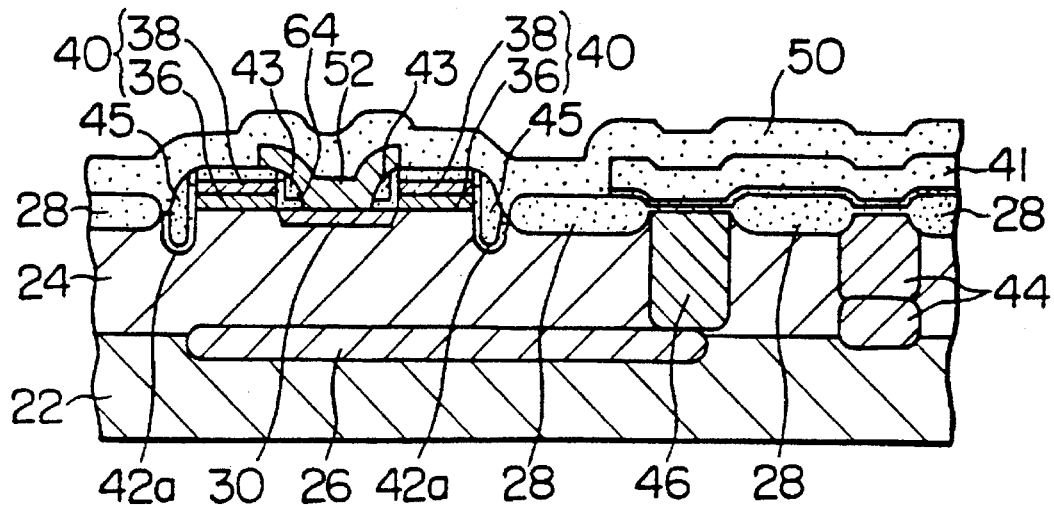

Next, as shown in FIG. 26, the inter-layer insulating layer 50 is produced on the surface of the semiconductor substrate on which the emitter take-out electrode 52 etc. are provided. The inter-layer insulating layer 50 is not particularly restricted, but maybe constituted by a silicon oxide film produced by for example the CVD method or a reflow film such as a PSG film or BPSG. The film thickness of this inter-layer insulating layer is for example about 100 to 500 nm.

Figure 27:
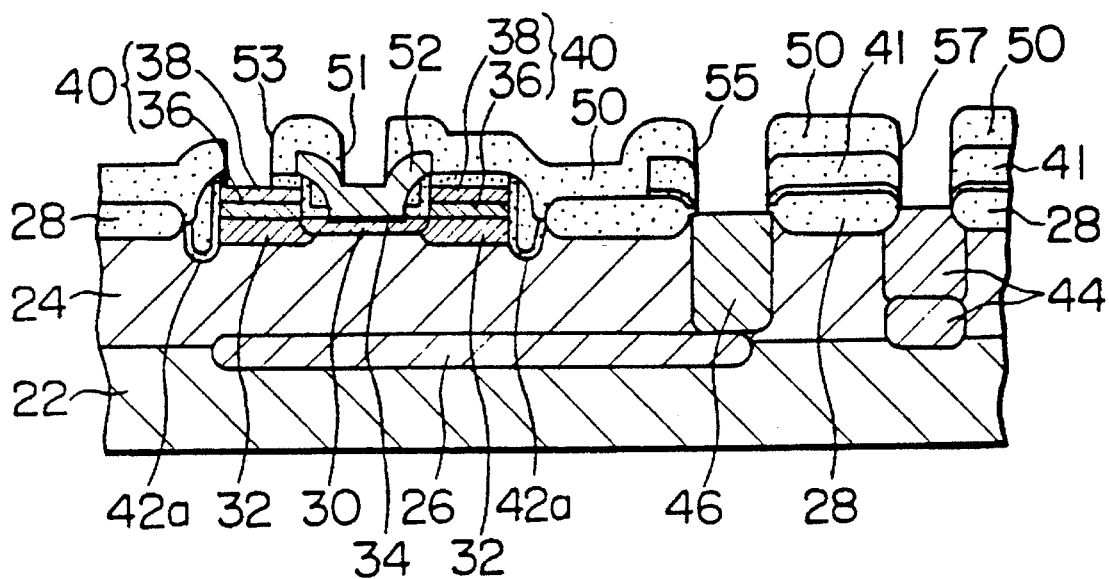

Next, as shown in FIG. 27, contact holes 51, 53, 55, and 57 for forming metal electrodes such as aluminum by burying are formed in the inter-layer insulating layer 50. The contact hole 51 is a contact hole for the emitter electrode. The contact hole 53 is a contact hole for the base electrode. The contact hole 55 is a contact hole for the collector electrode. The contact hole 57 is a contact hole for the element isolating electrode.

The semiconductor substrate is subjected to an annealing treatment before or after the formation of these contact holes 51, 53, 55, and 57. The annealing temperature is for example about 900° C. By this annealing treatment, an n-type impurity such as arsenic As contained in the emitter take-out electrode 52 is thermally diffused in the surface of the intrinsic base region 30, and the emitter region 34 of n$^+$ is formed by self-alignment. Also, simultaneously, a p-type impurity such as boron B, contained in the polycrystalline silicon layer 36 constituting the base electrode 40, is thermally diffused in the surface of the epitaxial layer 24 sectioned by the trench 42a, so that the graft base 32 of p$^+$ is formed. Note that, where a reflow film is used as the inter-layer insulating layer 50, a taper is formed at the edge of the upper portion of the contact hole at the annealing treatment, which is convenient.

Figure 28:
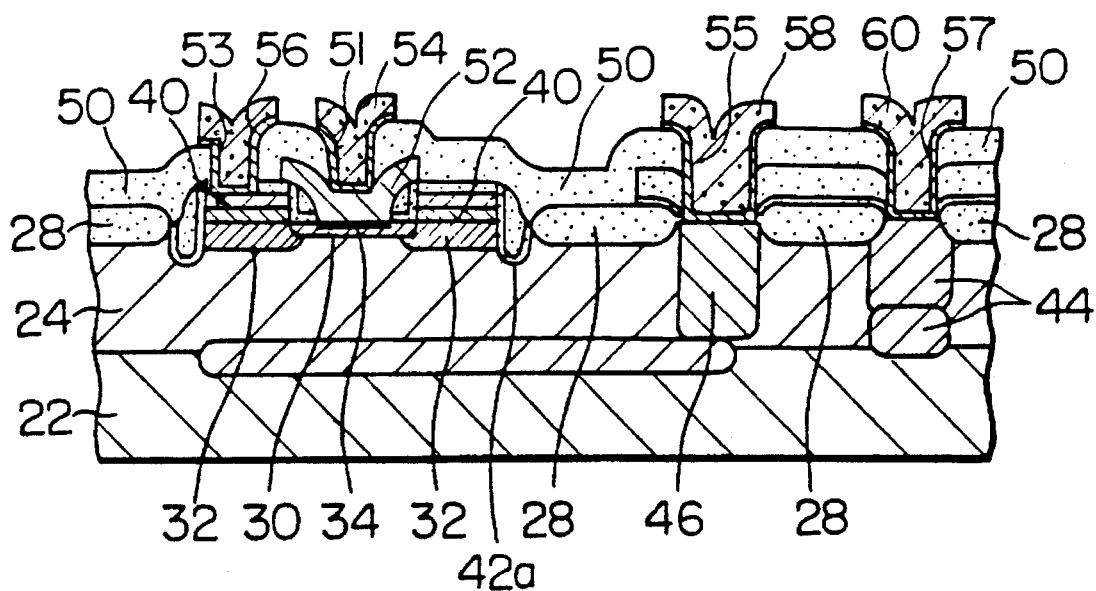

Finally, as shown in FIG. 28, the electrodes 54, 56, 68, and 60 are formed in the respective contact holes 51, 53, 55, and 57. The electrodes are constituted by metal electrodes such as for example aluminum. Preferably, the electrodes 54, 56, 58, and 60 have a two-layer construction in which a barrier metal such as titanium nitride is used as an underlaying layer, and the aluminum containing the silicon is laminated thereon. It is for preventing the absorption of the silicon on the substrate side by the aluminum electrode and, at the same time, for preventing the spike of the aluminum electrodes etc.

In the production process of the bipolar type semiconductor device according to the present embodiment, the trench 42 and the emitter region 34 are determined by self-alignment with respect to the base electrode 40, and therefore a bipolar type semiconductor device having the minimum dimensions and little variation in the transistor characteristics ($f_T$, etc.) can be easily fabricated.

Particularly, the present embodiment has an advantage that the groove depth of the trench 42a can be freely controlled and, at the same time, has an advantage that the size of the base can be correctly controlled just by the base electrode 40.

An explanation will be made next of an embodiment of the semiconductor device according to the second aspect of the present invention.

Figure 29:
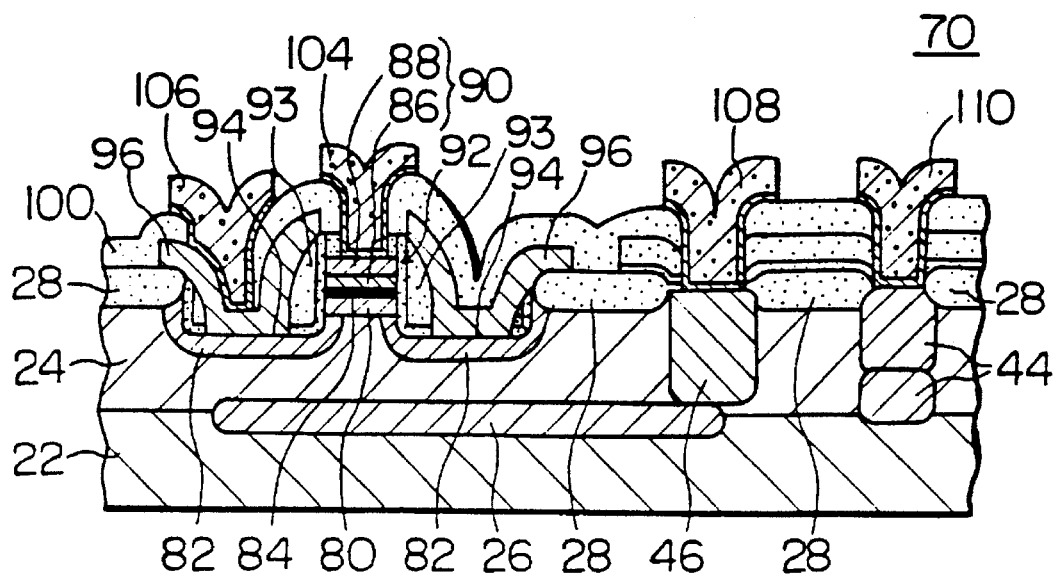
FIG. 29 is a schematic cross-sectional view showing one embodiment of a bipolar type semiconductor device according to a second aspect of the present invention.

As shown in FIG. 29, the bipolar type semiconductor device 70 of the present embodiment has a collector burying layer 26 provided near the boundary between a semiconductor substrate 22 and an epitaxial layer 24. The collector burying layer 26 has an n-type conductivity type where an npn-bipolar transistor is formed and is doped with an n-type impurity. Where a pnp-bipolar transistor is formed, a p-type impurity having a reverse conductivity type to this is doped. In the following explanation of embodiments, an explanation is made taking a case where the npn-bipolar transistor is formed as an example, but the present invention can be similarly applied also to the case where the a pnp-bipolar transistor is formed by all reversed conductivity types.

The conductivity type of the epitaxial layer 24 is an n-type, and this epitaxial layer 24 acts as the collector region. On the surface of the epitaxial layer 24, a field insulating region 28 is provided by a selective oxidation method (LOCOS method) or the like in a predetermined pattern of isolating elements. On the surface of the epitaxial layer 24 surrounded by the field insulating region 28, an n-type emitter region 84 and an emitter take-out electrode 90 are arranged in the vertical direction inside the column-like projection portion 92 surrounded by the trenches 94 and 94, provided on the surface of the semiconductor substrate. Then, the intrinsic base region 80 provided in the lower portion of the column-like projection portion 92 is connected to the p-type graft base 82 provided in the bottom portion of the trench 94.

The emitter take-out electrode 90 has a polycide construction comprising for example a polycrystalline silicon layer 86 and a silicide layer 88.

Note that, in FIG. 29, reference numeral 44 denotes the impurity diffusion region for isolating the elements, to which the p-type impurity has been doped. Also, reference numeral 46 denotes a collector take-out region, to which the n-type impurity has been doped. Reference numeral 93 denotes an insulation side wall isolating the base and emitter; reference numeral 96 denotes a base electrode; reference numeral 100 denotes an inter-layer insulating layer; reference numeral 104 denotes an electrode for the emitter; reference numeral 106 denotes an electrode for the base; reference numeral 108 denotes an electrode for collector; and reference numeral 110 denotes an electrode for isolating the elements.

In the bipolar type semiconductor device 70 of the present embodiment, the emitter region 84 and the base region 80 are arranged in a vertical direction inside a column-like projection portion 92 surrounded by the trench 94, and the emitter region 84 and base region 80 are joined at their substantially flat planes without curved parts at the joint part. Accordingly, the capacitance at the periphery in the depth direction of the emitter region and the capacitance of the curved part at the corner portion of the emitter region 84 can be reduced, and thus the capacitance between the emitter and base can be greatly reduced. Also, in the emitter-base contact, there is no curved part at which the voltage resistance is the weakest, and therefore the voltage resistance between the emitter and base is improved and, at the same time, the emitter clouding effect is reduced, and thus the transistor characteristics are improved.

Next, an explanation will be made of the production process of the embodiment according to the second aspect of the present invention. The present embodiment shares the same production steps as those shown in FIGS. 2 to 8 of the aforementioned embodiment, therefore no explanation thereof will be given.

Figure 30:
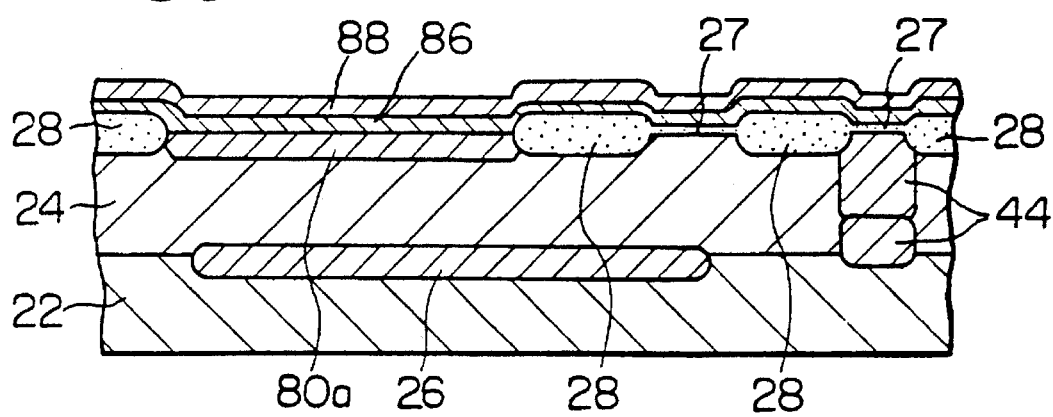
FIGS. 30 to 38 are schematic cross-sectional views showing the production processes of the semiconductor device according to the same embodiment.

In this embodiment, the collector burying layer 26, the epitaxial layer 24, the field insulating region 28, the stopper layer 27, and the impurity diffusion region for isolating the elements are formed on the surface of the semiconductor substrate 22 by the production steps shown in FIGS. 2 to 8. Then, as shown in FIG. 30, the stopper layer 27 is penetrated, and the selective ion implantation is carried out. An impurity diffusion layer 80a for forming the intrinsic base region is formed at the position between the field insulating regions 28 and 28 at which the bipolar transistor is formed. The ion implantation conditions for forming the impurity diffusion layer 80a forming the intrinsic base region are not particularly restricted, but preferably the conditions are that $BF_2^+$, which is a p-type impurity ion, is used as the impurity which will be ion-implanted, a dosage of $1\times10^{13}$ cm$^{-2}$, and 70 KeV. The diffusion depth of the impurity diffusion layer 80a acting as the intrinsic base region is for example about 0.1 to 0.2 μm.

Next, the stopper layer 27 between the field insulating regions in which the bipolar transistor is formed is selectivity removed. Next, on the surface of that semiconductor substrate, the polycrystalline silicon layer 86 and the silicide layer 88 serving as the conductive layer acting as the emitter take-out electrode are successively laid. As the silicide layer, tungsten silicide layer maybe used. The polycrystalline silicon layer 86 and the silicide layer 88 constitute the polycide construction. The total film thickness of the polycrystalline silicon layer 86 and the silicide layer 88 is for example about 150 to 300 nm.

In the bipolar transistor region, the polycrystalline silicon layer 86 acts as the diffusion source for forming the emitter region, and therefore after the polycrystalline silicon layer 86 and the silicide layer 88 are formed, the n-type impurity such as arsenic As is doped into the entire surface by the ion implantation. Note that, in the case of the BiCMOS process, the polycide electrode comprising the polycrystalline silicon layer 86 and the silicide layer 88 formed in the region of the bipolar transistor can be formed simultaneously with the gate electrode of the MOS transistor.

Figure 31:
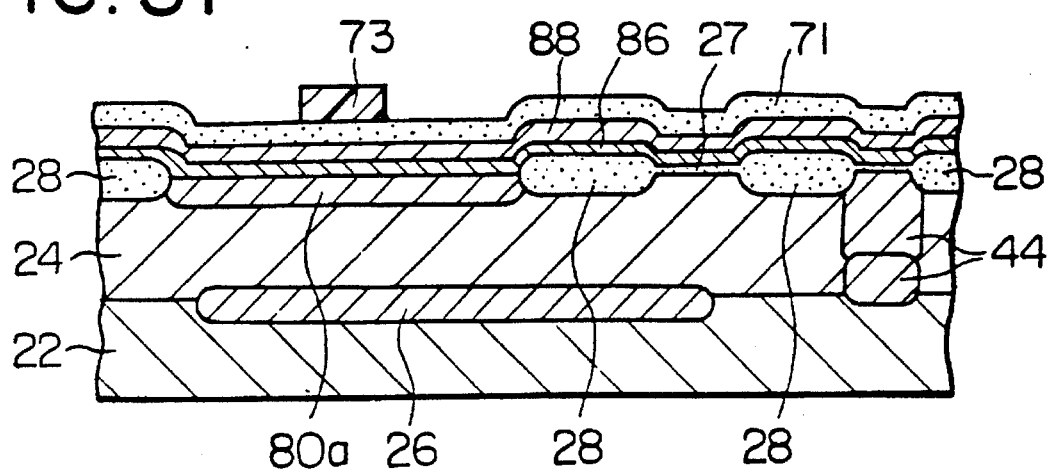
Figure 32:
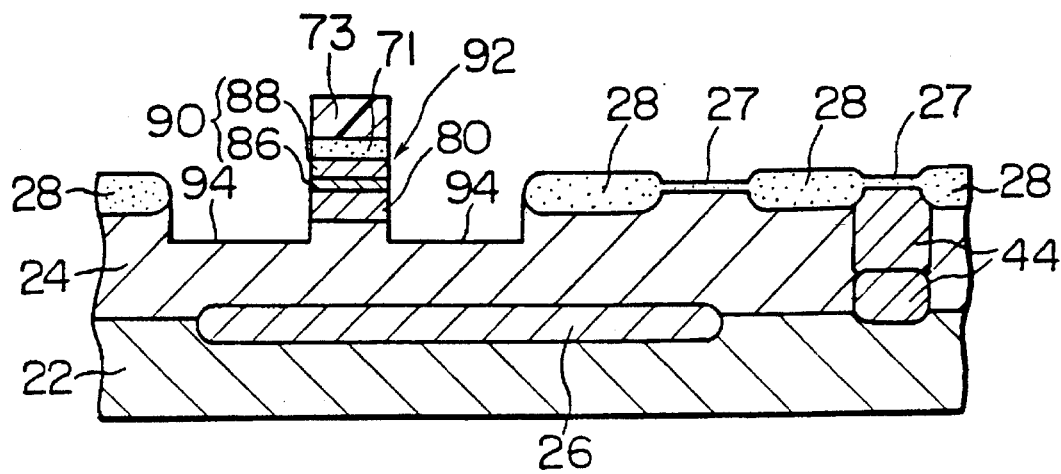

Note that, as shown in FIG. 31, on the polycide electrode, a cap layer 71 is produced. The cap layer 71 is constituted by a silicon oxide layer produced by for example the CVD method and has a film thickness thereof of for example about 50 to 300 nm. Next, a resist film 73 is produced on this cap layer. The resist film 73 is subjected to photolithography to the pattern corresponding to the emitter region and intrinsic base region. Next, as shown in FIG. 32, the cap layer 71, the silicide layer 88, and the polycrystalline silicon layer 86 are etched by RIE or the like using the resist film 73 as the mask, the trench 94 is formed on the surface of the epitaxial layer 24 and, at the same time, the column-like projection portion 92 is formed.

In the column-like projection portion 92, the emitter take-out electrode 90 having the polycide construction remaining after etching to form the trench 94 and the intrinsic base region 80 (region remaining after etching from the impurity diffusion layer 80a) are formed. The trench 94 is formed by self-alignment with respect to the emitter take-out electrode 90. The groove depth of this trench 94 is for example about 0.1 to 0.2 μm.

It is also possible to perform the formation of such a trench 94 simultaneously with the patterning of the gate electrode in the MOS transistor forming region in the case of the BiCMOS process.

Figure 33:
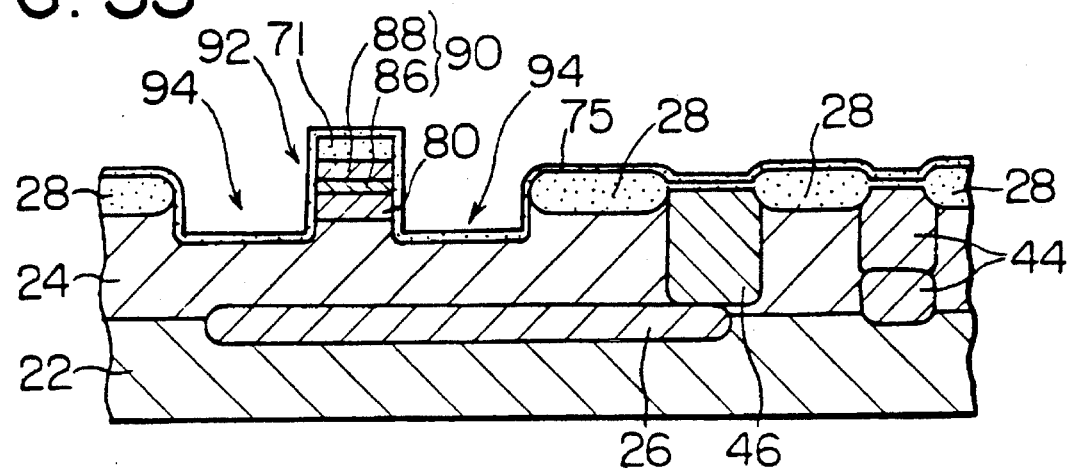

After the trench 94a is formed, as shown in FIG. 33, a buffer layer 75 is formed on the surface of the semiconductor substrate. The buffer layer 75 is constituted by a silicon oxide film having a thickness of about 10 nm produced by for example the CVD method, a TEOS-CVD method, or the like. The buffer layer 75 protects the polycide electrode constituting the emitter take-out electrode 90 and, at the same time, has a control function at the ion implantation. Note that, in the present embodiment, the buffer layer 75 does not always have to exist. Next, the selective ion implantation is carried out from above the buffer layer 75, and also the ion implantation for forming the collector take-out region 46 is carried out. The collector take-out region 46 is constituted by the n-type impurity diffusion region so as to be connected to the collector burying layer 26, and formed by for example the ion implantation method. The ion implantation condition is not particularly restricted, and the conditions are for example the use of the phosphorus P, a dosage amount of $1\times10^{15}$ cm$^{-2}$, and 500 KeV. After the ion implantation, heat treatment for diffusing the impurity is carried out. The heat treatment is carried out at the same temperature as the heat treatment temperature for forming the source drain region in the case of for example the BiCMOS process. Concretely, the heat treatment temperature is for example 800° to 1000° C. Note that, in the present invention, it is also possible not to perform the heat transistor at this stage and satisfy the same by the annealing treatment to be performed in later manufacturing step.

Figure 34:
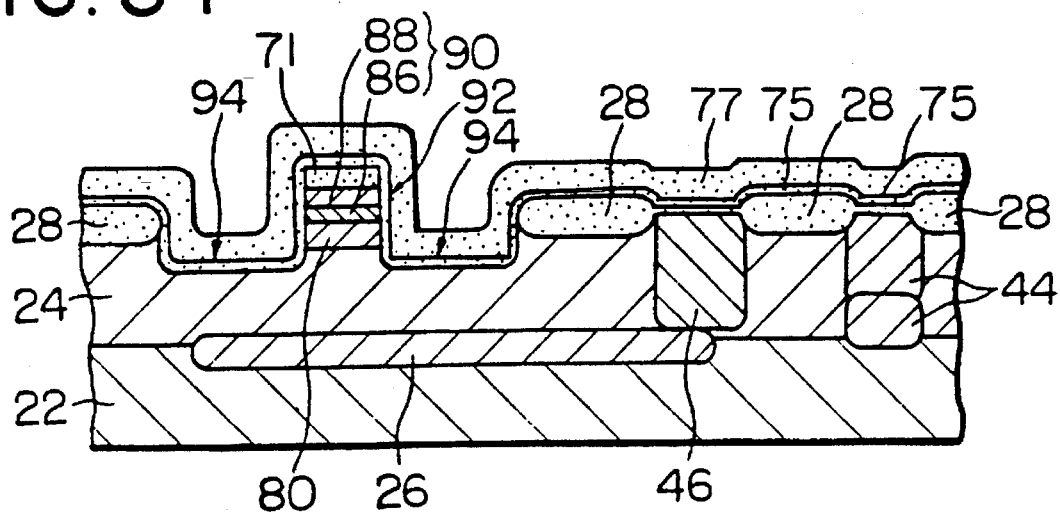

Next, as shown in FIG. 34, for forming the insulation side wall isolating the emitter and base, an insulating layer 77 is produced. The insulating layer 77 is constituted by a silicon oxide film having a thickness of about 100 to 300 nm produced by for example the CVD method.

Figure 35:
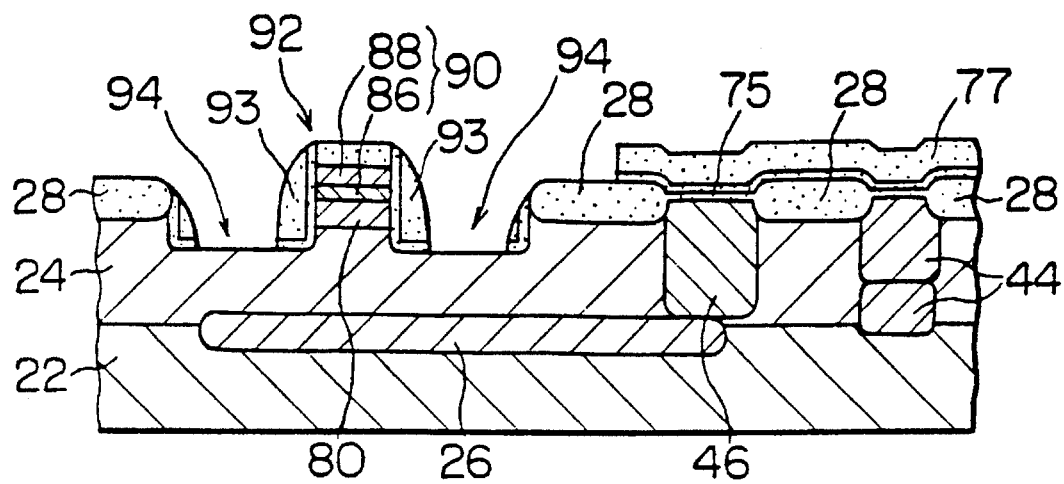

Next, as shown in FIG. 35, the insulating layer 77 is etched by an anisotropic etching such as RIE, and the insulation side wall 93 is formed on the side wall on the periphery of the column-like projection portion 92 in which the emitter take-out electrode 90 is provided. At this time, the surface of the epitaxial layer 24 is exposed in the bottom portion of groove of the trench 94. As will be mentioned later, the graft base is determined by self-alignment with respect to the insulation side wall 93.

Figure 36:
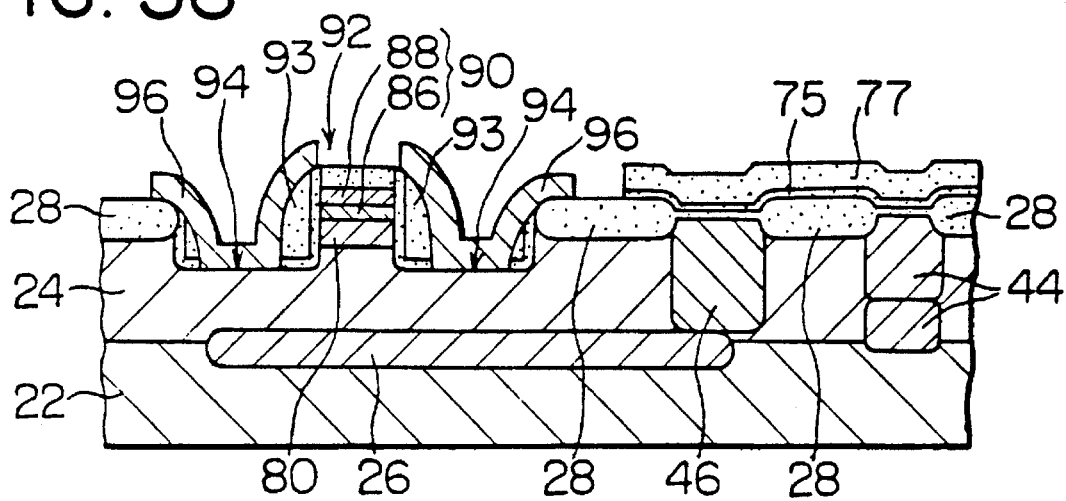

Next, as shown in FIG. 36, a polycrystalline silicon layer serving as the conductive layer forming the base electrode 96 is laid on the entire surface to a film thickness of for example 200 nm so as to enter into the trench 94 in which the insulation side wall 93 is provided. A p-type impurity such as boron B which is the impurity for forming the graft base is ion-implanted onto the entire surface of that polycrystalline silicon layer. Next, the polycrystalline silicon layer is subjected to the patterning by the RIE or the like, to obtain the base electrode 96.

Figure 37:
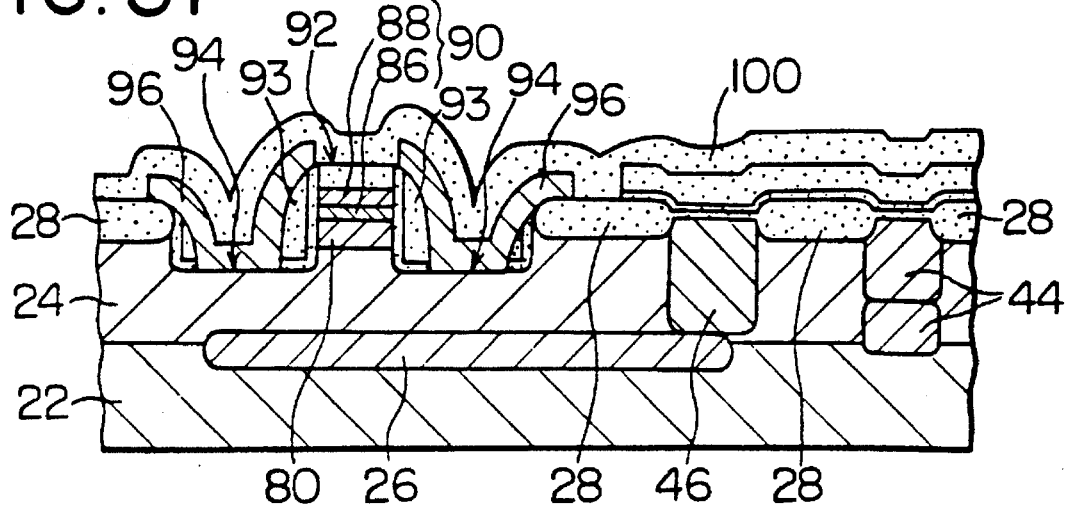

Next, as shown in FIG. 37, the inter-layer insulating layer 100 is deposited on the surface of the semiconductor substrate on which the base electrode 96 etc. are provided. The inter-layer insulating layer 100 is not particularly restricted, but may be constituted by a silicon oxide fill produced by for example the CVD method or a reflow fill such as a PSG fill or a BPSG fill. The fill thickness of this inter-layer insulating layer is for example about 100 to 500 nm.

Figure 38:
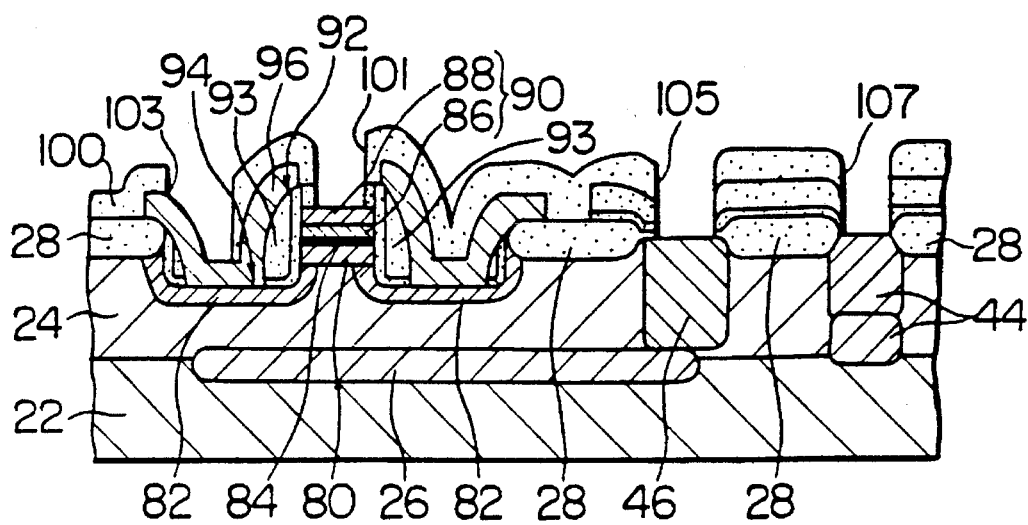

Next, as shown in FIG. 38, contact holes 101, 103, 105, and 107 for forming metal electrodes such as of aluminum by burying are formed in the inter-layer insulating layer 100. The contact hole 101 is a contact hole for the emitter electrode. The contact hole 103 is a contact hole for the base electrode. The contact hole 105 is a contact hole for the collector electrode. The contact hole 107 is a contact hole for the element isolating electrode.

The semiconductor substrate is subjected to an annealing treatment before or after the formation of these contact holes 101, 103, 105, and 107. The annealing temperature is for example about 900° C. By this annealing treatment, the n-type impurity such as arsenic As contained in the polycrystalline silicon layer 86 of the emitter take-out electrode 90 is thermally diffused in the surface of the intrinsic base region 80, and the emitter region 84 of $n^+$ is formed by self-alignment. Also, simultaneously, the p-type impurity such as boron B contained in the polycrystalline silicon layer constituting the base electrode 96 is thermally diffused in the surface of the epitaxial layer 24 exposed in the bottom portion of the trench 94, and thermally diffused to the intrinsic base region 80 provided in the lower portion of the column-like projection portion 92 and connected, so that the graft base 82 of $p^+$ is formed. Note that, where the reflow film is used as the inter-layer insulating layer 100, a taper is formed at the edge of upper portion of the contact hole at the annealing treatment, and thus it is convenient.

Finally, as shown in FIG. 29, the electrodes 104, 106, 108, and 110 are formed in the respective contact holes 101, 103, 105, and 107. The electrodes are constituted by metal electrodes such as aluminum. Preferably, the electrodes 104, 106, 108, and 110 have a two-layer construction in which a barrier metal such as titanium nitride is used as an underlying layer, and aluminum containing silicon is laminated thereon. This is for preventing the absorption of the silicon on the substrate side by the aluminum electrode and, at the same time, for preventing the spike of the aluminum electrode, etc.

In the production process of the bipolar type semiconductor device of the present embodiment, the trench and the graft base are determined by self-alignment with respect to the emitter electrode, and therefore a bipolar type semiconductor device having the minimum dimensions and little variation in the transistor characteristics ($f_T$, etc.) can be easily fabricated.

Next, an explanation will be made of another production process of the bipolar type semiconductor device according to the embodiment based on the second aspect of the present invention. The present embodiment is a modification of the embodiment shown in FIGS. 29 to 38, in which the graft base is formed by the ion implantation method. For this reason, the basic production steps of the present embodiment are similar to those of the embodiment shown in FIGS. 29 to 38, and the production steps shown in FIGS. 2 to 8 and the production steps shown in FIGS. 30 to 35 are the same. Therefore an explanation thereof will be omitted.

Figure 39:
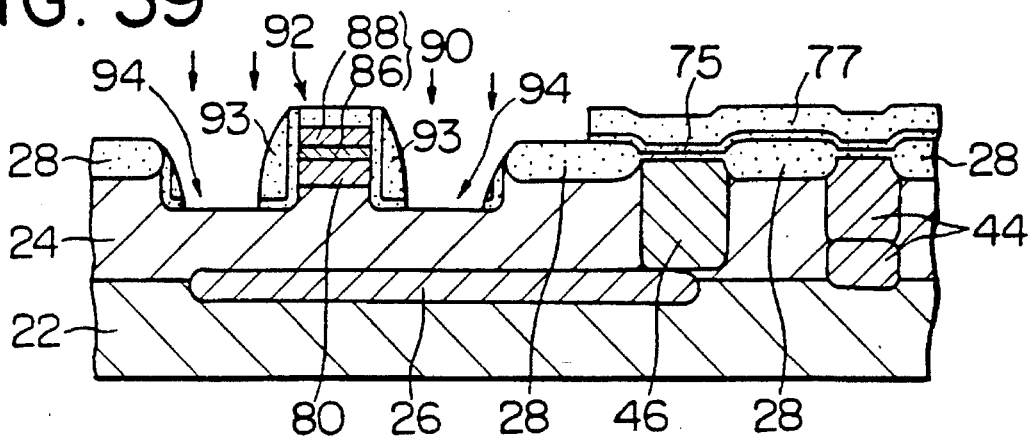
FIGS. 39 to 42 are schematic cross-sectional views showing another production process of the bipolar type semiconductor device according to the second aspect of the present invention.

In the present embodiment, as shown in FIG. 39, the trench 94 and the column-like projection portion 92 are formed in the same way as the embodiment shown in FIG. 29 to 38, the insulation side wall 93 is formed on the side wall on the periphery of the column-like projection portion 92, and then the ion implantation is carried out with respect to the bottom portion of the trench 94 so as to form the graft base.

As the impurity used in the ion implantation, a p-type impurity such as boron is used. The ion implantation conditions are not particularly restricted, but preferably the conditions are a dosage of $1\times10^{15}$ cm$^{-2}$ and an energy of 30 KeV. Also, the implantation angle at the ion implantation may preferably be inclined from that under the usual conditions, and the ion implantation may be carried out at an inclination angle of for example 45 degrees. Preferably the substrate is relatively rotated. This is because, by performing such an inclined ion implantation, where the impurity implanted into the bottom portion of the trench 94 is thermally diffused, an easy connection between the graft base 82 and the intrinsic base region 80 provided in the lower portion of the column-like projection portion 92 is made.

Figure 40:
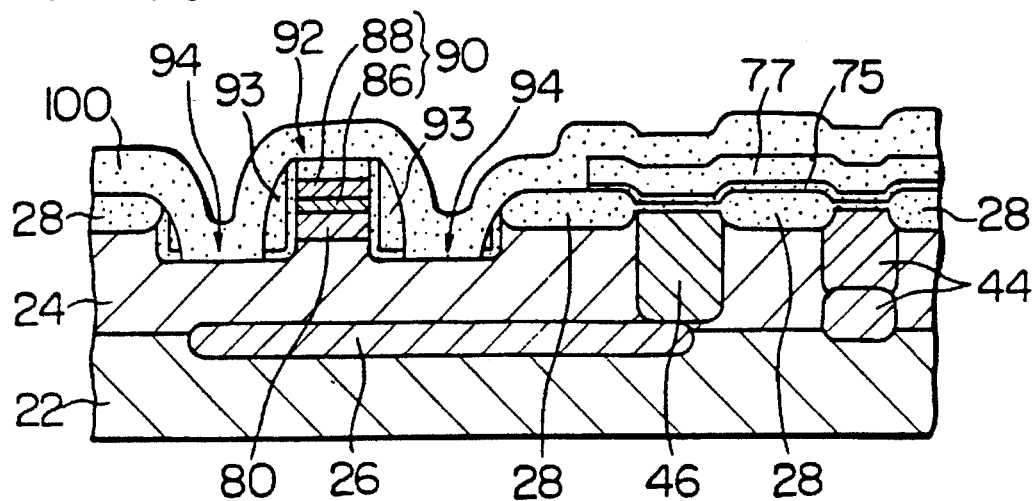

Next, as shown in FIG. 40, the inter-layer insulating layer 100 is produced on the surface of the semiconductor substrate on which the trench 94 etc. are provided. The inter-layer insulating layer 100 is not particularly restricted, but maybe constituted by a silicon oxide film produced by for example the CVD method or a reflow film such as a PSG film or BPSG film. The film thickness of this inter-layer insulating layer is for example about 100 to 500 nm.

Figure 41:
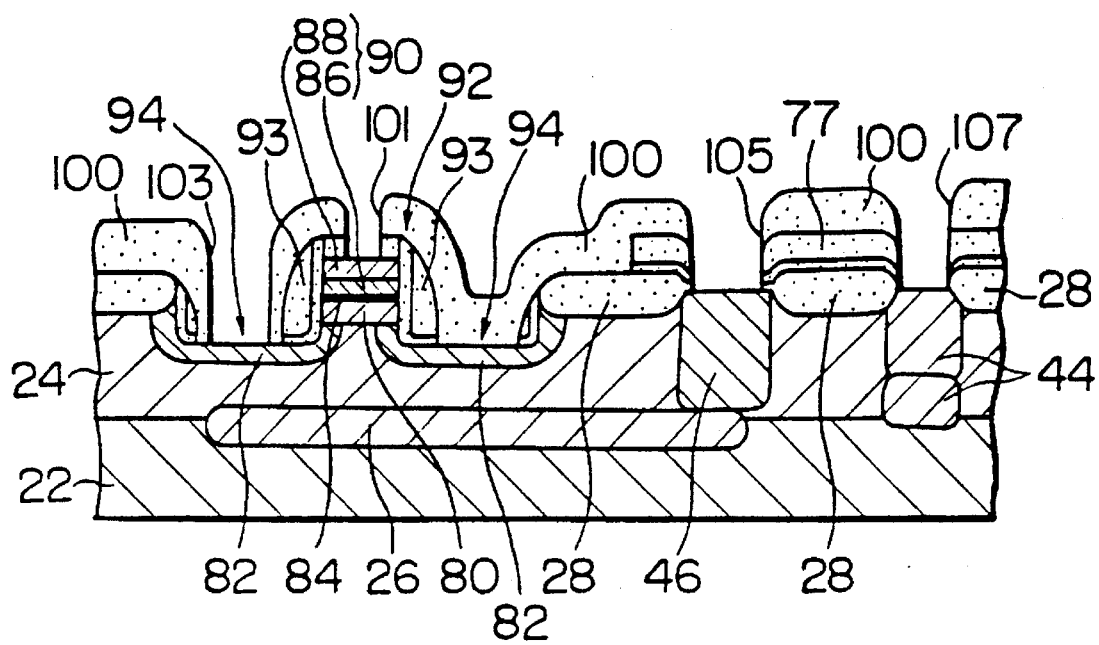

Next, as shown in FIG. 41, contact holes 101, 103, 105, and 107 for forming the metal electrodes such as of aluminum by burying are formed in the inter-layer insulating layer 100. The contact hole 101 is a contact hole for the emitter electrode. The contact hole 103 is a contact hole for the base electrode. The contact hole 105 is a contact hole for the collector electrode. The contact hole 107 is a contact hole for the element isolating electrode.

The semiconductor substrate is subjected to an annealing treatment before or after the formation of these contact holes 101, 103, 105, and 107. The annealing temperature is for example about 900° C. By this annealing treatment, an n-type impurity such as arsenic As contained in the polycrystalline silicon layer 86 of the emitter take-out electrode 90 is thermally diffused in the surface of the intrinsic base region 80, and the emitter region 84 of $n^{30}$ is formed by self-alignment. Also, simultaneously, the p-type impurity such as boron B ion-implanted into the bottom portion of the trench 94 is thermally diffused at the surface of the epitaxial layer 24, and thermally diffused to the intrinsic base region 80 provided in the lower portion of the column-like projection portion 92 and connected, so that the graft base 82 of p⁺ is formed. Note that, where the reflow film is used as the inter-layer insulating layer 100, a taper is formed at the edge of the upper portion of the contact hole at the annealing treatment, and thus it is convenient.

Figure 42:
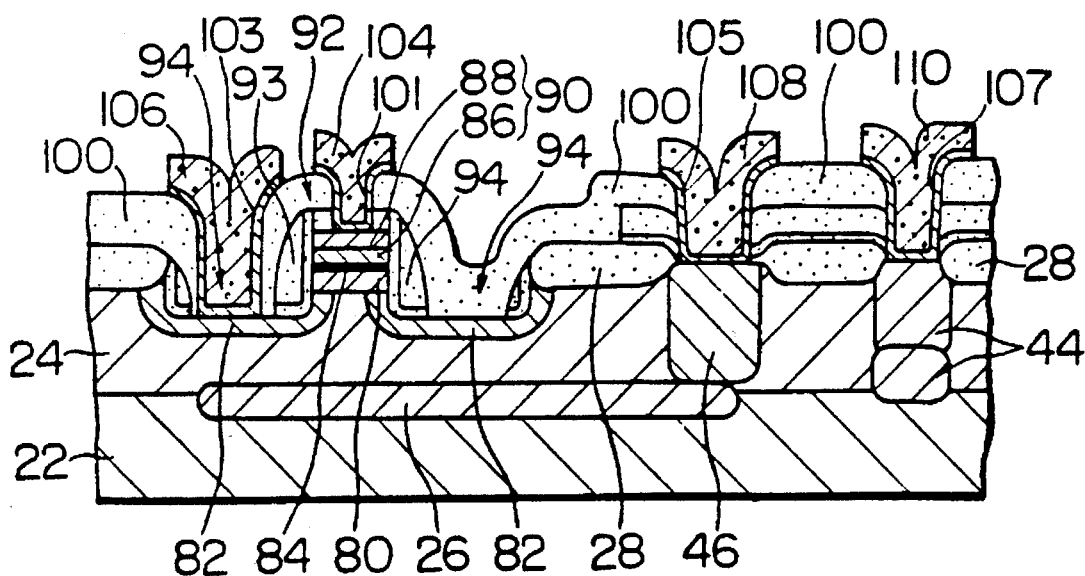

Finally, as shown in FIG. 42, the electrodes 104, 106, 108, and 110 are formed in the respective contact holes 101, 103, 105, and 107. The electrodes are constituted by a metal electrode such as for example aluminum. Preferably, the electrodes 104, 106, 108, and 110 have a two-layer construction in which a barrier metal such as titanium nitride is used as an underlaying layer, and aluminum containing silicon is laminated thereon. This is for preventing the absorption of the silicon on the substrate side by the aluminum electrode and, at the same time, for preventing the spike of the aluminum electrode, etc.

In the production process of the present embodiment, the trench and the graft base are determined by self-alignment with respect to the emitter electrode, and therefore a bipolar type semiconductor device having the minimum dimensions and little variation in the transistor characteristics ($f_T$ etc.) can be easily fabricated. Also, particularly in the present embodiment, the graft base 82 is formed by the ion implantation method, and therefore there is an advantage in that this graft base 82 is easily connected with respect to the intrinsic base region 80.

An explanation will be made next of the embodiment of the semiconductor device according to the third aspect of the present invention.

Figure 43:
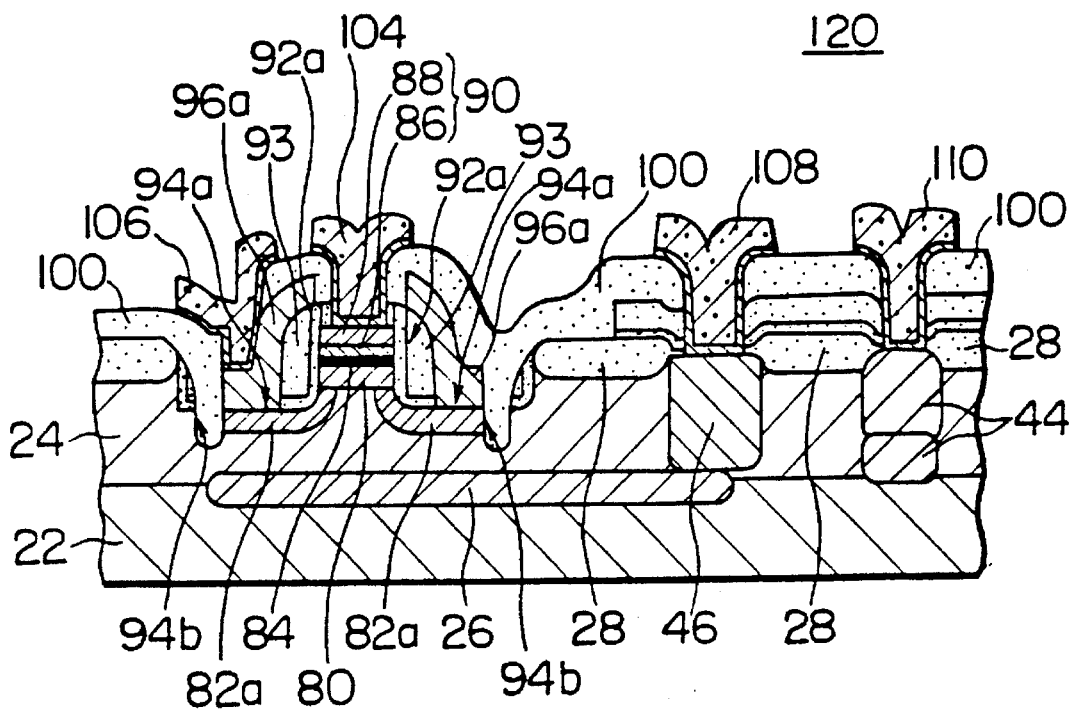
FIG. 43 is a schematic cross-sectional view showing one embodiment of a bipolar type semiconductor device according to a third aspect of the present invention.

As shown in FIG. 43, the bipolar type semiconductor device 120 of the present embodiment has a collector burying layer 26 provided near the boundary between a semiconductor substrate 22 and an epitaxial layer 24. The conductivity type of the collector burying layer 26 is an n-type where an npn-bi polar transistor is formed, and to which the n-type impurity has been doped. Where a pnp-bipolar transistor is formed, the p-type impurity having a reverse conductivity type to this is doped. In the following explanation of embodiments, an explanation is made taking a case where the npn-bipolar transistor is formed as an example, but the present invention can be similarly applied also to the case where the pnp-bi polar transistor is formed by all reversed conductivity types.

The conductivity type of the epitaxial layer 24 is an n-type, and this epitaxial layer 24 acts as the collector region. On the surface of the epitaxial layer 24, a field insulating region 28 is provided by a selective oxidation method (LOCOS method) or the like with the predetermined pattern of isolating the elements. On the surface of the epitaxial layer 24 surrounded by the field insulating region 28, the n-type emitter region 84 and the emitter take-out electrode 90 are arranged in a vertical direction inside the column-like projection portion 92a surrounded by the first trench 94a, provided on the surface of the semiconductor substrate. Then, the intrinsic base region 80 provided in the lower portion of the column-like projection portion 92a is connected to the p-type graft base 82a provided in the bottom portion of the first trench 94a.

The emitter take-out electrode 90 has a polycide construction comprising for example the polycrystalline silicon layer 86 and the silicide layer 88.

Particularly, in the present embodiment, the second trench 94b is provided in the bottom portion of the first trench 94a, and the outer circumference of the graft base 82a is determined by this second trench 94b.

Note that, in FIG. 43, reference numeral 44 denotes an insulation side wall of isolating the base and emitter; and reference numeral 44 denotes an impurity diffusion region for isolating the elements and to which the p-type impurity has been doped. Also, reference numeral denotes a collector take-out region, to which the n-type impurity has been doped. Reference numeral 93 denotes an insulation side wall isolating the base and emitter; reference numeral 96a denotes a base electrode; reference numeral 100 denotes an inter-layer insulating layer; reference numeral 104 denotes an electrode for a emitter; reference numeral 106 denotes an electrode for a base; reference numeral 108 denotes an electrode for a collector; and reference numeral 110 denotes an electrode for isolating the elements.

In the bipolar type semiconductor device 120 of the present embodiment, the emitter region 84 and the base region 80 are arranged in a vertical direction inside a column-like projection portion 92 surrounded by the first trench 94, and the emitter region 84 and base region 80 are joined at their substantially flat planes without curved parts at the joint part. Accordingly, the capacitance at the periphery in the depth direction of the emitter region 84 and the capacitance of the curved part at the corner portion of the emitter region 84 can be reduced, and thus the capacitance between the emitter and base can be greatly reduced. Also, in the emitter-base contact, there is no curved part at which the voltage resistance is the weakest, and therefore the voltage resistance between the emitter and base is improved and, at the same time, the emitter clouding effect is reduced, and thus the transistor characteristics are improved.

Further, in the present embodiment, the second trench 94b is formed also on the outer circumference side of the graft base 82a and defined thereat, and therefore the capacitance between the base and collector is reduced, and also the voltage resistance between the base and collector is improved.

Next, an explanation will be made of the production process of the embodiment according to the third aspect of the present invention. The present embodiment shares the production steps shown in FIGS. 2 to 8 of the aforementioned embodiment and the production steps shown in FIGS. 30 to 35, and therefore an explanation thereof will be omitted.

Figure 44:
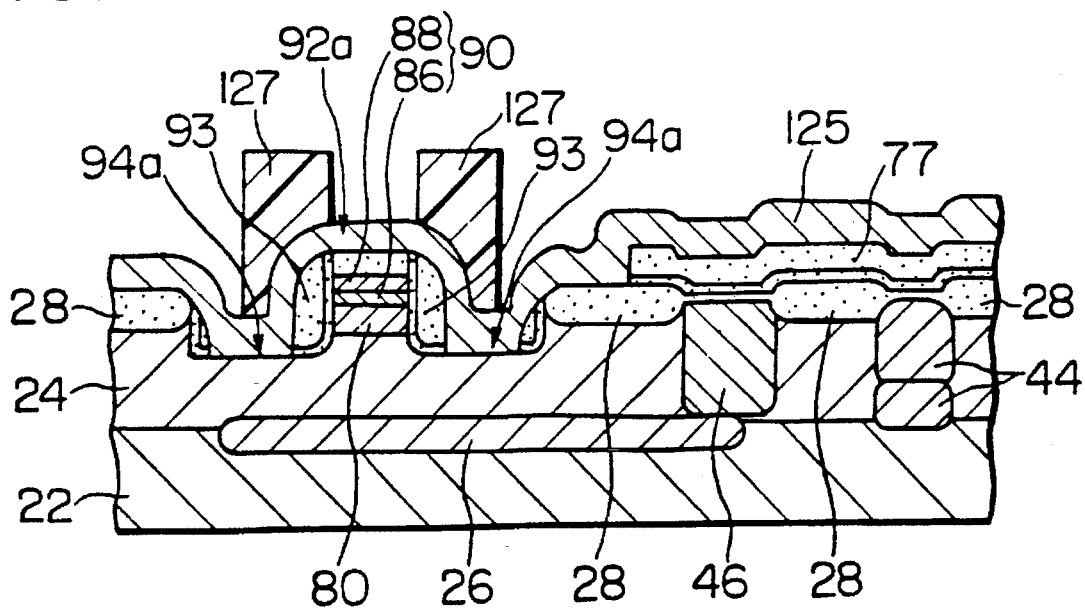
FIGS. 44 to 47 are schematic cross-sectional views showing the production steps of the semiconductor device of the same embodiment.

After passing the manufacturing steps shown in FIGS. 2 to 8 and FIGS. 30 to 35, as shown in FIG. 44, the first trench 94a and the insulation side wall 93 are formed on the surface of the semiconductor substrate, and then a polycrystalline silicon layer 125 serving as the conductive layer acting as the base electrode is formed on the surface of the semiconductor substrate. The film thickness of the polycrystalline silicon layer 125 is not particularly restricted, but for example maybe about 200 nm. The p-type impurity such as boron B, which is the impurity for forming the graft base, is ion-implanted into the entire surface of the polycrystalline silicon layer 125. Next, a resist film 127 is formed on the polycrystalline silicon layer 125 with a pattern covering almost the entire surface of the first trench 94a while leaving one part on the outer circumference side of the first trench 94a.

Figure 45:
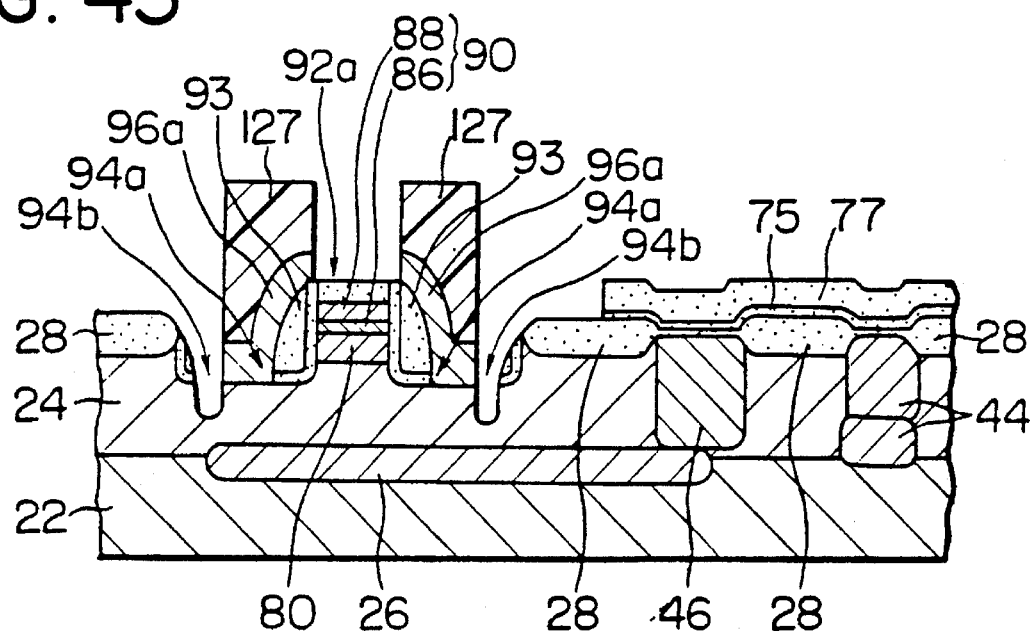

Next, as shown in FIG. 45, the polycrystalline silicon layer 125 is etched by RIE or the like using the resist film 127 as them ask, and the base electrode 96a entering into the first trench 94a is formed. The base electrode 96a is formed by patterning the polycrystalline silicon layer 125, but at this time, the second trench 94b is formed on the outer circumference side of the bottom portion of the first trench 94a. The second trench 94b is in contact with the outer circumference of the graft base as mentioned later, thereby to determine the graft base.

Figure 46:
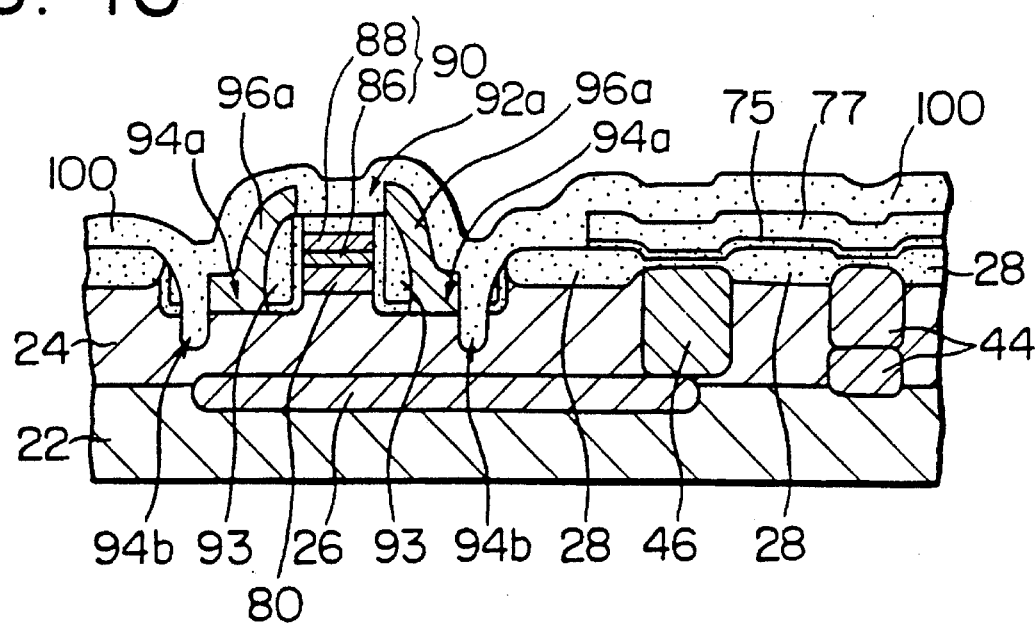

Next, as shown in FIG. 46, the inter-layer insulating layer 100 is produced on the surface of the semiconductor substrate on which the base electrode 96a etc. are provided. The inter-layer insulating layer 100 is not particularly restricted, but constituted by a silicon oxide film produced by for example the CVD method or a reflow film such as a PSG film or BPSG film. The film thickness of this inter-layer insulating layer is for example about 100 to 500 nm. At that time, the second trench 94b is buried by the inter-layer insulating layer, and thus the insulation by the second trench 94b becomes possible.

Figure 47:
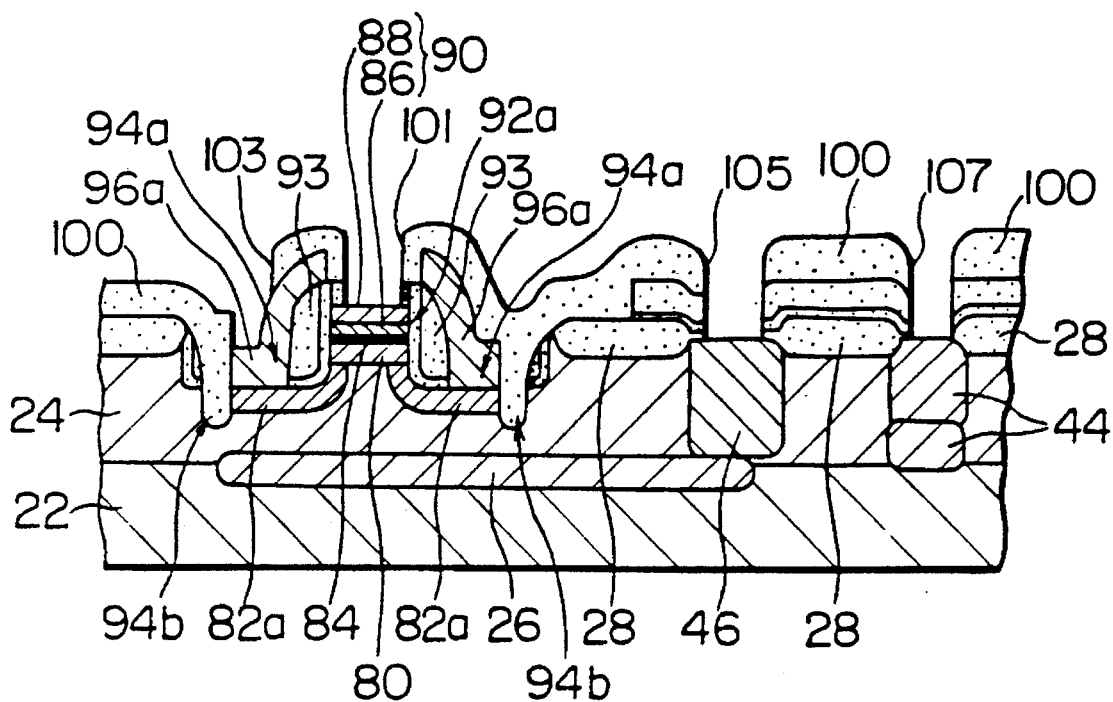
Figure 48:
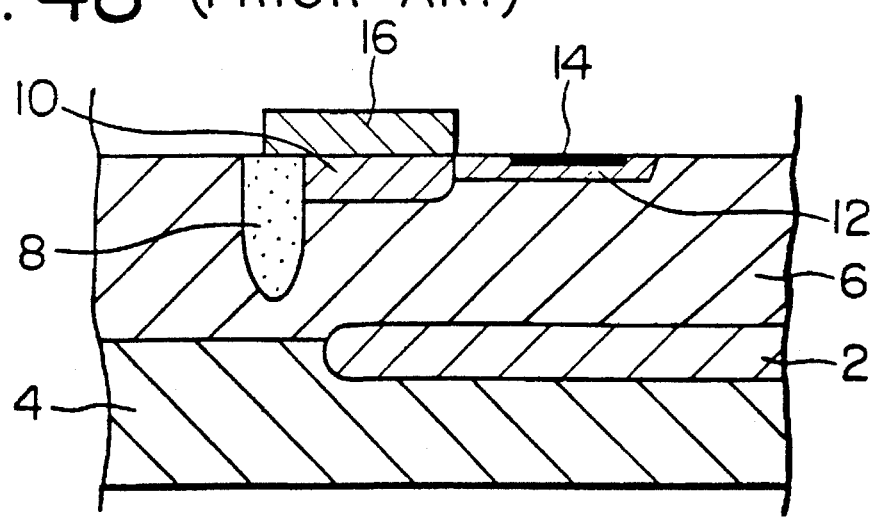
FIG. 48 is a schematic cross-sectional view of principal part of the bipolar type semiconductor device according to a conventional example.

Next, as shown in FIG. 47, contact holes 101, 103, 105, and 107 for forming metal electrode such as of aluminum by burying are formed in the inter-layer insulating layer 100. The contact hole 101 is a contact hole for the emitter electrode. The contact hole 103 is a contact hole for the base electrode. The contact hole 105 is a contact hole for the collector electrode. The contact hole 107 is a contact hole for the element isolating electrode.

The semiconductor substrate is subjected to an annealing treatment before or after the formation of these contact holes 101, 103, 105, and 107. The annealing temperature is for example about 900° C. By this annealing treatment, an n-type impurity such as arsenic As contained in the polycrystalline silicon layer 86 of the emitter take-out electrode 90 is thermally diffused in the surface of the intrinsic base region 80, and the emitter region 84 of $n^+$ is formed by self-alignment. Also, simultaneously, a p-type impurity such as boron B contained in the polycrystalline silicon layer constituting the base electrode 96a is thermally diffused in the surface of the epitaxial layer 24 exposed in the bottom portion of the first trench 94a, and thermally diffused to the intrinsic base region 80 provided in the lower portion of the column-like projection portion 92a and connected, so that the graft base 82a of $p^+$ is formed. The end portion on the outer circumference side of the graft base 82a is in contact with the second trench 94b, whereby the size of that region is determined.

Note that, where a reflow film is used as the inter-layer insulating layer 100, a taper is formed at the edge of upper portion of the contact hole at the annealing treatment, which is convenient.

Finally, as shown in FIG. 43, the electrodes 104, 106, 108, and 110 are formed in the respective contact holes 101, 103, 105, and 107. The electrodes are constituted by a metal electrode such as for example aluminum. Preferably, the electrodes 104, 106, 108, and 110 have a two-layer construction in which a barrier metal such as titanium nitride is used as an underlaying layer, and aluminum containing silicon is laid thereon. This is for preventing the absorption of the silicon on the substrate side by the aluminum electrode and, at the same time, for preventing the spike of the aluminum electrode, etc.

In the production process of the bipolar type semiconductor device according to the present embodiment, the first trench and the graft base are determined by self-alignment with respect to the emitter electrode, and therefore a bipolar type semiconductor device having the minimum dimensions and little variations in the transistor characteristic ($f_T$ etc.) can be easily produced. Particularly, in the present embodiment, the second trench 94b is formed also on the periphery of the graft base 82a, and therefore the capacitance between the base and collector is reduced, and also the voltage resistance between the base and collector is improved.

Note that, the present invention is not restricted to the above-mentioned embodiments and can be modified in various ways within the scope of the present invention.

I claim:

1. A production process of a bipolar type semiconductor device, comprising the steps of:

forming an epitaxial layer of a first conductivity type as a collector region on a surface of a semiconductor substrate;

forming an impurity diffusion region of a second conductivity type as an intrinsic base region on the surface of the epitaxial layer, an upper portion of said intrinsic base region later becoming an emitter region;

laying a conductive layer as an emitter take-out electrode on said impurity diffusion region, said conductive layer as the emitter take-out electrode containing an impurity of the first conductivity type;

forming a column-like projection portion having a lateral cross-section corresponding in lateral extent to said emitter region by etching through the conductive layer as the emitter take-out electrode, the impurity diffusion region, and a portion of said collector region with a pattern corresponding to the emitter region and forming a trench in the epitaxial layer at a periphery of the column-like projection portion;

forming an insulation side wall on a side wall of said column-like projection for insulating the emitter region from a graft base to be later formed at a bottom portion of said trench;

forming in said bottom portion of said trench said graft base connected to said intrinsic base region; and forming the emitter region by diffusing said impurity of the first conductivity type contained in the conductive layer as the emitter take-out electrode into said upper portion of said intrinsic base region.

2. A production process according to claim 1 including the steps of forming a base electrode in said trench, an impurity of a second conductivity type provided in said base electrode, and then thermally diffusing said impurity of said second conductivity type contained in the base electrode into said bottom portion of said trench to form said graft base.

3. A production process according to claim 1 including the step of forming said graft base by introducing and thermally diffusing an impurity of said second conductivity type by ion implantation into said bottom portion of said trench.

4. A production process according to claim 1 wherein said conductive layer as said emitter take-out electrode is formed by a polycrystalline silicon layer as a diffusion source for said impurity of said second conductivity type, and a silicide above the polycrystalline silicon layer.

5. A production process of a bipolar type semiconductor device, comprising the steps of:

forming an epitaxial layer of a first conductivity type as a collector region on a surface of a semiconductor substrate;

forming an impurity diffusion region of a second conductivity type as an intrinsic base region on a surface of the epitaxial layer, an upper portion of said intrinsic base region later becoming an emitter region;

laying a conductive layer as an emitter take-out electrode on said impurity diffusion region, said conductive layer as the emitter take-out electrode containing an impurity of the first conductivity type;

forming a column-like projection portion having a lateral cross-section corresponding in lateral extent to an emitter region by etching said conductive layer as the emitter take-out electrode, said impurity diffusion region, and the surface of said epitaxial layer with a pattern corresponding to the emitter region and forming a first trench in the epitaxial layer at a periphery of the column-like projection;

forming an insulation side wall on a side wall of said column-like projection for insulating the emitter region from a graft base to be later formed in a bottom portion in said trench;

forming a conductive layer as a base electrode at a bottom portion of said first trench, said conductive layer as said base electrode having an impurity of said second conductivity type;

forming a second trench for defining an outer circumference of the graft base at an outer circumference side of said bottom portion of said first trench;

forming the emitter region by diffusing said impurity of the first conductivity type contained in the conductive layer as the emitter take-out electrode into said upper portion of the intrinsic base region; and forming the graft base in said bottom portion of said first trench and surrounded by said second trench by thermally diffusing said impurity of said second conductivity type contained in the conductive layer as the base electrode, said graft base connecting to the intrinsic base.

6. A production process according to claim 5 wherein the conductive layer as the emitter take-out electrode is formed by a polycrystalline silicon layer as a diffusion source for said impurity of said first conductivity type, and a silicide layer above the polycrystalline silicon layer.

7. A production process according to claim 5 wherein the step of forming the second trench occurs at the same time that the base electrode is being patterned in said first trench.

8. A production process of a bipolar type semiconductor device, comprising the steps of:

providing a collector region of a first conductivity type in a semiconductor layer;

forming an impurity diffusion region of a second conductivity type as an intrinsic base region on a surface of the semiconductor layer, an upper portion of said intrinsic base region later becoming an emitter region;

laying a conductive layer as an emitter take-out electrode on said impurity diffusion region, said conductive layer as the emitter take-out electrode containing an impurity of the first conductivity type;

forming a column-like projection portion having a lateral cross-section corresponding in lateral extent to said emitter region by etching through the conductive layer as the emitter take-out electrode, the impurity diffusion region, and a portion of said collector region with a pattern corresponding to the emitter region and forming a trench in the semiconductor layer at a periphery of the column-like projection portion;

forming an insulation side wall on a side wall of said column-like projection for insulating the emitter region from a graft base to be later formed at a bottom portion of said trench;

forming in said bottom portion of said trench said graft base connected to said intrinsic base region; and forming the emitter region by diffusing said impurity of the first conductivity type contained in the conductive layer as the emitter take-out electrode into said upper portion of said intrinsic base region.

9. A production process of a bipolar type semiconductor device, comprising the steps of:

providing a collector region of a first conductivity type in a semiconductor layer;

forming an impurity diffusion region of a second conductivity type as an intrinsic base region on a surface of the semiconductor layer, an upper portion of said intrinsic base region later becoming an emitter region;

laying a conductive layer as an emitter take-out electrode on said impurity diffusion region, said conductive layer as the emitter take-out electrode containing an impurity of the first conductivity type;

forming a column-like projection portion having a lateral cross-section corresponding in lateral extent to an emitter region by etching said conductive layer as the emitter take-out electrode, said impurity diffusion region, and the surface of said semiconductor layer with a pattern corresponding to the emitter region and forming a first trench in the semiconductor layer at a periphery of the column-like projection;

forming an insulation side wall on a side wall of said column-like projection for insulating the emitter region from a graft base to be later formed in a bottom portion in said trench;

forming a conductive layer as a base electrode at a bottom portion of said first trench, said conductive layer as said base electrode having an impurity of said second conductivity type;

forming a second trench for defining an outer circumference of the graft base at an outer circumference side of said bottom portion of said first trench;

forming the emitter region by diffusing said impurity of the first conductivity type contained in the conductive layer as the emitter take-out electrode into said upper portion as the intrinsic base region; and forming the graft base in said bottom portion of said first trench and surrounded by said second trench by thermally diffusing said impurity of said second conductivity type contained in the conductive layer of the base electrode, said graft base connecting to the intrinsic base.

* * * * *